United States Patent
Kabe et al.

(10) Patent No.: US 9,691,827 B2
(45) Date of Patent: Jun. 27, 2017

(54) DISPLAY DEVICE

(71) Applicant: Japan Display Inc., Minato-ku (JP)

(72) Inventors: Masaaki Kabe, Minato-ku (JP); Kojiro Ikeda, Minato-ku (JP); Tsutomu Harada, Minato-ku (JP); Akira Sakaigawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/950,487

(22) Filed: Nov. 24, 2015

(65) Prior Publication Data

US 2016/0155776 A1    Jun. 2, 2016

(30) Foreign Application Priority Data

Nov. 28, 2014    (JP) .................. 2014-241878

(51) Int. Cl.
*H01L 27/32*    (2006.01)

(52) U.S. Cl.
CPC ...... *H01L 27/3218* (2013.01); *H01L 27/3216* (2013.01); *H01L 27/3244* (2013.01)

(58) Field of Classification Search
CPC . H01L 27/32; H01L 27/3214; H01L 27/3216; H01L 27/3244
See application file for complete search history.

(56) References Cited

U.S. PATENT DOCUMENTS

| 7,515,122 B2* | 4/2009 | Miller ................. G09G 3/3216 315/169.3 |
| 7,697,012 B2* | 4/2010 | Lee ...................... G06T 3/4092 345/613 |
| 8,952,374 B2* | 2/2015 | Jinta ................... H01L 27/3218 257/40 |
| 2009/0315921 A1 | 12/2009 | Sakaigawa et al. |
| 2010/0141693 A1 | 6/2010 | Lee et al. |

FOREIGN PATENT DOCUMENTS

WO    WO 2008/130203 A1    10/2008

\* cited by examiner

*Primary Examiner* — Matthew Reames
(74) *Attorney, Agent, or Firm* — Oblon, McClelland, Maier & Neustadt, L.L.P.

(57) ABSTRACT

According to an aspect, a display device includes a display unit in which a plurality of pixels are arranged in a matrix along two directions intersecting with each other. Each of the pixels includes three sub-pixels corresponding to three of four colors including a first color, a second color, a third color, and a fourth color. An area of one sub-pixel among the three sub-pixels is larger than the area of each of the other two sub-pixels. A sub-pixel of the fourth color is one of the other two sub-pixels. Pixels each including the sub-pixel of the fourth color are not adjacent to each other in at least one of the two directions in the display unit.

4 Claims, 19 Drawing Sheets

FIG.6

| PIXEL ARRAY | LUMINANCE OF SINGLE COLOR | WHITE LUMINANCE | WIDTH OF SUB-PIXEL (550 ppi) |
|---|---|---|---|
| 48S<br>R\|G\|B | 1 | 1 | 15.4 μm |
| 48T<br>R\|G\|B\|W | 0.75 | 0.75 | 11.55 μm |
| 49C, 49A, 49B, 48<br>(R/G, B, R/G, W / R/G, W, R/G, B) | 0.71 | 0.71 | 23.1 μm |
| SECOND EMBODIMENT THIRD EMBODIMENT FOURTH EMBODIMENT AND MODIFICATION | 0.82 | 0.82 | 23.1 μm |

FIG.10

| | | SCANNING LINE THAT IS TURNED ON | | | | | | |
|---|---|---|---|---|---|---|---|---|
| | | SCL1 | SCL2 | SCL3 | SCL4 | SCL5 | SCL6 | SCL7 |
| OUTPUT SIGNAL OUTPUT TO SIGNAL LINE | DTL1 | B (1, 1) | R (2, 1) | G (3, 1) | B (4, 1) | R (5, 1) | G (6, 1) | - |
| | DTL2 | - | G (1, 1) | W (2, 1) | R (3, 1) | W (4, 1) | B (5, 1) | W (6, 1) |
| | DTL3 | R (1, 1) | G (2, 1) | B (3, 1) | R (4, 1) | G (5, 1) | B (6, 1) | - |
| | DTL4 | R (1, 2) | G (2, 2) | B (3, 2) | R (4, 2) | G (5, 2) | B (6, 2) | - |
| | DTL5 | - | w (1, 2) | R (2, 2) | w (3, 2) | B (4, 2) | w (5, 2) | G (6, 2) |
| | DTL6 | G (1, 2) | b (2, 2) | R (3, 2) | g (4, 2) | B (5, 2) | r (6, 2) | - |
| | DTL7 | G (1, 3) | B (2, 3) | R (3, 3) | G (4, 3) | B (5, 3) | R (6, 3) | - |
| | DTL8 | - | R (1, 3) | w (2, 3) | B (3, 3) | w (4, 3) | G (5, 3) | w (6, 3) |
| | DTL9 | b (1, 3) | R (2, 3) | g (3, 3) | B (4, 3) | r (5, 3) | G (6, 3) | - |
| | DTL10 | B (1, 4) | R (2, 4) | G (3, 4) | B (4, 4) | R (5, 4) | G (6, 4) | - |
| | DTL11 | - | w (1, 4) | B (2, 4) | w (3, 4) | G (4, 4) | w (5, 4) | R (6, 4) |
| | DTL12 | R (1, 4) | g (2, 4) | B (3, 4) | r (4, 4) | G (5, 4) | b (6, 4) | - |
| | DTL13 | R (1, 5) | G (2, 5) | B (3, 5) | R (4, 5) | G (5, 5) | B (6, 5) | - |
| | DTL14 | - | B (1, 5) | w (2, 5) | G (3, 5) | w (4, 5) | R (5, 5) | w (6, 5) |
| | DTL15 | g (1, 5) | B (2, 5) | r (3, 5) | G (4, 5) | b (5, 5) | R (6, 5) | - |
| | DTL16 | G (1, 6) | B (2, 6) | R (3, 6) | G (4, 6) | B (5, 6) | R (6, 6) | - |
| | DTL17 | - | w (1, 6) | G (2, 6) | w (3, 6) | R (4, 6) | w (5, 6) | B (6, 6) |
| | DTL18 | B (1, 6) | r (2, 6) | G (3, 6) | b (4, 6) | R (5, 6) | g (6, 6) | - |

FIG.11

| OUTPUT SIGNAL (w) | | TWO VALUES TO BE AVERAGED | |
|---|---|---|---|
| | w (1, 2) | W (1, 1) | W (1, 2) |
| | w (1, 4) | W (1, 3) | W (1, 4) |
| | w (1, 6) | W (1, 5) | W (1, 6) |
| | w (2, 3) | W (2, 2) | W (2, 3) |
| | w (2, 5) | W (2, 4) | W (2, 5) |
| | w (3, 2) | W (3, 1) | W (3, 2) |
| | w (3, 4) | W (3, 3) | W (3, 4) |
| | w (3, 6) | W (3, 5) | W (3, 6) |
| | w (4, 3) | W (4, 2) | W (4, 3) |
| | w (4, 5) | W (4, 4) | W (4, 5) |
| | w (5, 2) | W (5, 1) | W (5, 2) |
| | w (5, 4) | W (5, 3) | W (5, 4) |
| | w (5, 6) | W (5, 5) | W (5, 6) |
| | w (6, 3) | W (6, 2) | W (6, 3) |
| | w (6, 5) | W (6, 4) | W (6, 5) |

FIG.12

| OUTPUT SIGNAL (r) | | TWO VALUES TO BE AVERAGED | |
|---|---|---|---|
| | r (2, 6) | R (2, 5) | R (2, 6) |
| | r (3, 5) | R (3, 4) | R (3, 5) |
| | r (4, 4) | R (4, 3) | R (4, 4) |
| | r (5, 3) | R (5, 2) | R (5, 3) |
| | r (6, 2) | R (6, 1) | R (6, 2) |

FIG.13

| OUTPUT SIGNAL (g) | TWO VALUES TO BE AVERAGED | |
|---|---|---|
| g (1, 5) | G (1, 4) | G (1, 5) |
| g (2, 4) | G (2, 3) | G (2, 4) |
| g (3, 3) | G (3, 2) | G (3, 3) |
| g (4, 2) | G (4, 1) | G (4, 2) |
| g (6, 6) | G (6, 5) | G (6, 6) |

FIG.14

| OUTPUT SIGNAL (b) | TWO VALUES TO BE AVERAGED | |
|---|---|---|
| b (1, 3) | B (1, 2) | B (1, 3) |
| b (2, 2) | B (2, 1) | B (2, 2) |
| b (4, 6) | B (4, 5) | B (4, 6) |
| b (5, 5) | B (5, 4) | B (5, 5) |
| b (6, 4) | b (6, 3) | b (6, 4) |

US 9,691,827 B2

DISPLAY DEVICE

CROSS-REFERENCE TO RELATED APPLICATIONS

This application claims priority from Japanese Application No. 2014-241878, filed on Nov. 28, 2014, the contents of which are incorporated by reference herein in its entirety.

BACKGROUND

1. Technical Field

The present invention relates to a display device.

2. Description of the Related Art

In the related art, known are display devices using four colors of red (R), green (G), blue (B), and white (W) as colors of a plurality of sub-pixels constituting a pixel. By including a sub-pixel of white (W) in addition to sub-pixels of three colors of red (R), green (G), and blue (B) in a pixel, the display device can allocate, to the sub-pixel of white (W), a component including all of the three colors of red (R), green (G), and blue (B) among luminance components output from the pixel.

However, the display device in which the pixel is constituted of the sub-pixels of four colors includes the sub-pixel of white (W), so that an area of a display region that can be allocated to the sub-pixels of red (R), green (G), and blue (B) is reduced corresponding to the area of the sub-pixel of white (W). Thus, in the display device in which the pixel is constituted of the sub-pixels of four colors, as compared with the display device in which the pixel is constituted of the sub-pixels of only three colors of red (R), green (G), and blue (B), luminance of at least one or more colors among the three colors the output signal value of which is large is undesirably reduced, for example, luminance of a color (single color) represented by using any of the sub-pixels of three colors of red (R), green (G), and blue (B).

Such a problem as described above is not only related to the display device using the four colors of red (R), green (G), blue (B), and white (W) as the colors of the sub-pixels, but also related to a display device using four or more colors as the colors of the sub-pixels. That is, in the display device including the sub-pixels of four or more colors, the area of the sub-pixels that can be allocated to three colors including a first color, a second color, and a third color among the four or more colors is smaller than that in the display device including the sub-pixels of only three colors.

For the foregoing reasons, there is a need for a display device that includes sub-pixels of four colors of a first color, a second color, a third color, and a fourth color and can cause the luminance of the first color, the second color, and the third color to be higher. Alternatively, there is a need for a display device that can achieve an advantage obtained by using the fourth color in addition to the first color, the second color, and the third color as the colors of the sub-pixels, and higher luminance of the first color, the second color, and the third color at the same time.

SUMMARY

According to an aspect, a display device includes a display unit in which a plurality of pixels are arranged in a matrix along two directions intersecting with each other. Each of the pixels includes three sub-pixels corresponding to three of four colors including a first color, a second color, a third color, and a fourth color. An area of one sub-pixel among the three sub-pixels is larger than the area of each of the other two sub-pixels. A sub-pixel of the fourth color is one of the other two sub-pixels. Pixels each including the sub-pixel of the fourth color are not adjacent to each other in at least one of the two directions in the display unit.

BRIEF DESCRIPTION OF THE DRAWINGS

FIG. 6 is a diagram illustrating an example of a comparison of patterns of sub-pixels constituting the pixel when luminance of a first color, a second color, and a third color as a single color, white luminance, and a width of the sub-pixel in one direction (for example, a row direction) are converted into numerical values for each of the patterns;

FIG. 10 is a diagram illustrating an example of a relation between an output signal output to the signal line illustrated in FIG. 9 and scanning timing based on an output to the scanning line;

FIG. 11 is a diagram illustrating an alternative output example of an output corresponding to the output signal of a color that cannot be output at a position corresponding to coordinates (m, n) of the pixel;

FIG. 12 is a diagram illustrating an alternative output example of the output corresponding to the output signal of the color that cannot be output at the position corresponding to the coordinates (m, n) of the pixel;

FIG. 13 is a diagram illustrating an alternative output example of the output corresponding to the output signal of the color that cannot be output at the position corresponding to the coordinates (m, n) of the pixel;

FIG. 14 is a diagram illustrating an alternative output example of the output corresponding to the output signal of the color that cannot be output at the position corresponding to the coordinates (m, n) of the pixel;

DETAILED DESCRIPTION

Figure 1:
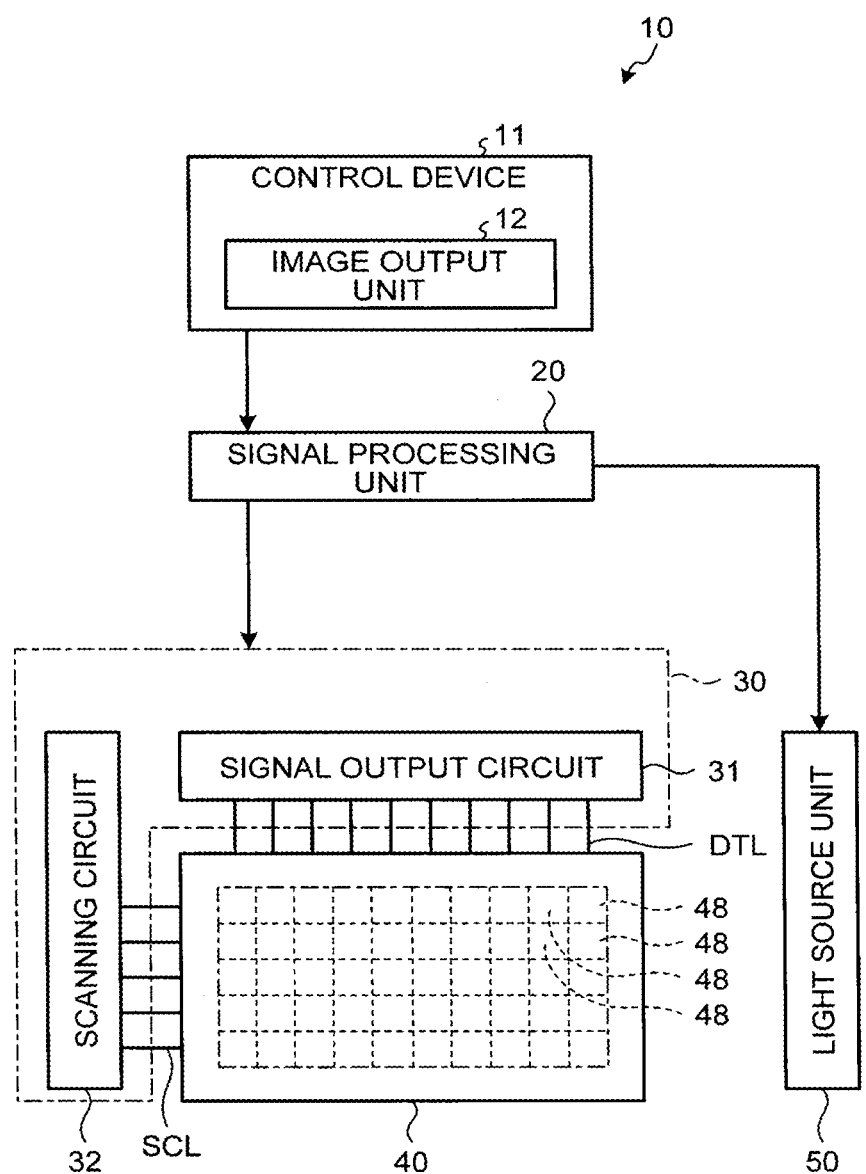
FIG. 1 is a block diagram illustrating an example of a configuration of a display device according to a first embodiment for implementing the present invention.

The following describes embodiments of the present invention in detail with reference to the drawings. The present invention is not limited to the embodiments described below. Components described below include a component that is easily conceivable by those skilled in the art and substantially the same component. The components described below can be appropriately combined. The disclosure is merely an example, and the present invention naturally encompasses an appropriate modification maintaining the gist of the invention that is easily conceivable by those skilled in the art. To further clarify the description, a width, a thickness, a shape, and the like of each component may be schematically illustrated in the drawings as compared with an actual aspect. However, this is merely an example and interpretation of the invention is not limited thereto. The same element as that described in the drawing that has already been discussed is denoted by the same reference numeral through the description and the drawings, and detailed description thereof will not be repeated in some cases.

First Embodiment

Figure 2:
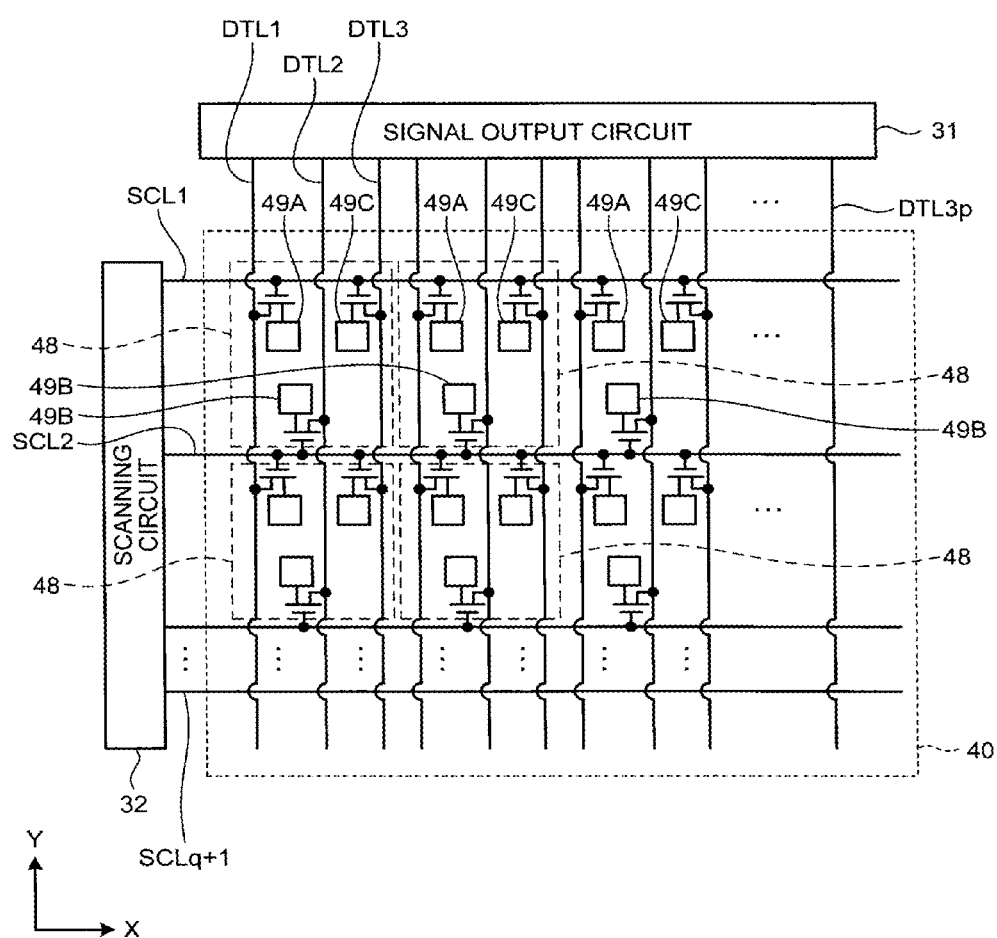
FIG. 2 is a conceptual diagram of an image display panel and an image-display-panel drive circuit of the display device according to the first embodiment.

FIG. 1 is a block diagram illustrating an example of a configuration of a display device according to a first embodiment for implementing the present invention. FIG. 2 is a conceptual diagram of an image display panel and an image display panel drive circuit of the display device according to the first embodiment. As illustrated in FIG. 1, a display device 10 includes a signal processing unit 20 that receives an input signal (for example, RGB data) and performs certain data conversion processing on the input signal and outputs an output signal, an image display panel 40 that functions as a display unit and displays an image, an image-display-panel drive circuit 30 that controls driving of the image display panel 40 based on the output signal output from the signal processing unit 20, and a light source unit 50 that illuminates the image display panel 40 from a back surface thereof, for example.

The signal processing unit 20 controls each of operations of the image display panel 40 and the light source unit 50 in synchronization with each other. The signal processing unit 20 is coupled to the image-display-panel drive circuit 30 for driving the image display panel 40, and to the light source unit 50 that illuminates the image display panel 40. The signal processing unit 20 processes the input signal to generate the output signal and a light source control signal.

That is, the signal processing unit 20 converts, for example, an input value (input signal) of an input HSV (Hue-Saturation-Value, Value is also called Brightness) color space indicated by the input signal into an extended value of an extended HSV color space extended with components of a first color, a second color, a third color, and a fourth color, and outputs an output signal based on the extended value to the image-display-panel drive circuit 30. The signal processing unit 20 outputs the light source control signal corresponding to the output signal to the light source unit 50. The input signal is, for example, output from a control device 11 including an image output unit 12 in an electronic apparatus to which the display device 10 is provided, and input to the signal processing unit 20.

As illustrated in FIGS. 1 and 2, in the image display panel 40, a plurality of pixels 48 are arrayed in a two-dimensional matrix. In the example illustrated in FIG. 2, p×q pixels 48 are arrayed in a matrix on an XY two-dimensional coordinate system. In this example, a row direction is the X-direction, and a column direction is the Y-direction. In this way, the pixels 48 are arranged in a matrix along two directions intersecting with each other (for example, the row direction and the column direction).

The image-display-panel drive circuit 30 includes a signal output circuit 31 and a scanning circuit 32. The image-display-panel drive circuit 30 holds video signals with the signal output circuit 31, and sequentially outputs the video signals to the image display panel 40. The signal output circuit 31 is electrically coupled to the image display panel 40 via a signal line DTL. The image-display-panel drive circuit 30 controls, with the scanning circuit 32, ON/OFF of a switching element (for example, a thin film transistor (TFT)) for controlling an operation of the sub-pixel (for example, display luminance, and in this case, light transmittance) in the image display panel 40. The scanning circuit 32 is electrically coupled to the image display panel 40 via a scanning line SCL. As illustrated in FIG. 2, when p×q pixels 48 are arrayed in a matrix, the number of signal lines DTL (the number of lines) is 3p [lines] and the number of scanning lines SCL (the number of lines) is q+1 [lines]. In the description of the first embodiment, when it is not necessary to distinguish signal lines DTL1, DTL2, ..., and DTL3p from each other, they may be collectively referred to as signal lines DTL. When it is not necessary to distinguish scanning lines SCL1, SCL2, ..., and SCLq+1 from each other, they may be collectively referred to as scanning lines SCL. Among the pixels 48, the pixels in one pixel row arranged along the row direction share two scanning lines SCL. Among pixel rows the number of which is q, two pixel rows adjacent to each other in the column direction share one scanning line SCL. Among the pixels 48, the pixels in one pixel column arranged along the column direction share three signal lines DTL.

The light source unit 50 includes, for example, a light source such as a light emitting diode (LED), and illuminates the image display panel 40 according to supply of electric power and the light source control signal output from the signal processing unit 20. The light source unit 50 is, for example, arranged at the back surface side of the image display panel 40, and emits light toward the image display panel 40 to illuminate the image display panel 40. The light source unit 50 adjusts electric current, a voltage, or a duty ratio of a signal based on the light source control signal, which are to be supplied to the light source unit 50, and controls quantity of light emitted to the image display panel 40 (light intensity). The light source unit 50 may be arranged at the front surface side of the image display panel 40 as a front light. When a self-luminous display device such as an organic light emitting diode (OLED) display device is used as the image display panel 40, the light source unit 50 is not required.

Figure 3:
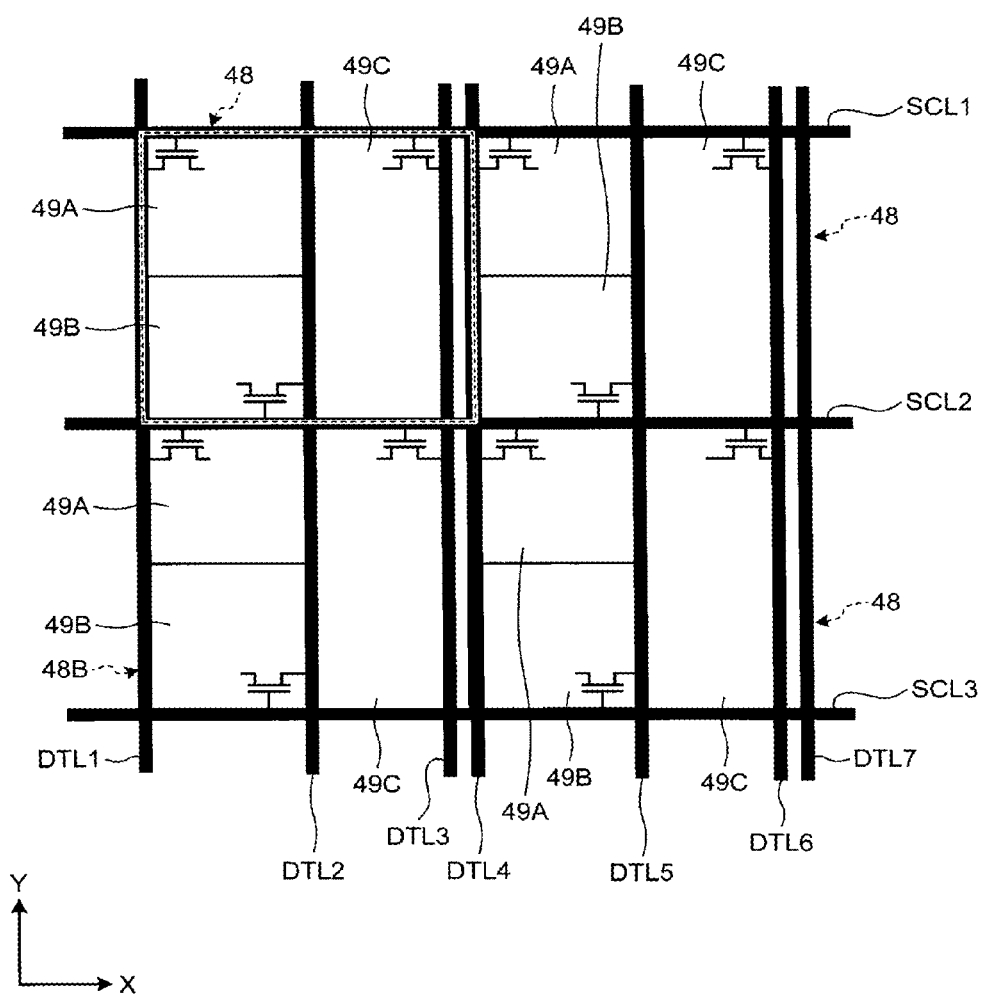
FIG. 3 is a diagram illustrating a pixel arrangement in part of the image display panel according to the first embodiment.

FIG. 3 is a diagram illustrating a pixel arrangement in part of the image display panel according to the first embodiment. As illustrated in FIGS. 2 and 3, the pixel 48 includes three sub-pixels 49A, 49B, and 49C. In the description of the first embodiment, when it is not necessary to distinguish the three sub-pixels 49A, 49B, and 49C from each other, they may be collectively referred to as sub-pixels 49. Reference numerals of the three sub-pixels 49A, 49B, and 49C in the first embodiment are used for distinguishing arrangements and areas of the sub-pixels 49 in the pixel 48 illustrated in FIGS. 2 and 3, not for distinguishing the colors of the sub-pixels 49 from each other.

The area of one of the three sub-pixels 49A, 49B, and 49C (for example, the sub-pixel 49C) is larger than each of the areas of the other two sub-pixels (in this case, the sub-pixels 49A and 49B). Specifically, as illustrated in FIG. 3 for example, the area of the sub-pixel 49C present on the right side of one pixel 48 is larger than each of the areas of the sub-pixels 49A and 49B present on the left side of the pixel 48. A positional relation among the sub-pixels 49A, 49B, and 49C in FIG. 3 is merely an example, and can be appropriately modified. For example, as in a third embodiment described later, the left sub-pixels 49A and 49B may be replaced with the right sub-pixel 49C. A relation between the row direction and the column direction in the arrangement of the sub-pixels 49 may be replaced with each other. In this case, wiring directions of the signal line DTL and the scanning line SCL are also replaced with each other.

In the example of FIG. 3, the sub-pixels 49A and 49B are arranged at a position sandwiched between two signal lines DTL of three signal lines DTL that are coupled to one pixel 48. The sub-pixels 49A and 49B are arranged to divide a region enclosed by the two signal lines DTL and two scanning lines SCL wired on upper and lower sides of the pixel 48 into two. In the first embodiment, the sub-pixels 49A and 49B each include a region obtained by uniformly dividing the enclosed region into two with a dividing line along the row direction. However, the areas of the sub-pixels 49A and 49B are not necessarily uniform. The dividing direction is not limited to the row direction, and may be the column direction. The dividing direction may be any other directions along a display surface of the image display panel 40. In the first embodiment, a sub-pixel corresponding to an upper region of the regions divided by the dividing line along the row direction is the sub-pixel 49A, and a sub-pixel corresponding to a lower region thereof is the sub-pixel 49B. The sub-pixel 49C is a sub-pixel including a region between the right one of the two signal lines DTL positioned to sandwich the sub-pixels 49A and 49B among the three signal lines DTL that are coupled to one pixel 48 and the rest one of the signal lines DTL among the three signal lines DTL, the region being enclosed by the two scanning lines SCL wired on the upper and lower sides of the pixel 48.

In the first embodiment, as illustrated in FIG. 2, the sub-pixels 49A and 49C are coupled to the scanning line SCL arranged on the upper side of the pixel 48, and the sub-pixel 49B is coupled to the scanning line SCL arranged on the lower side of the pixel 48. However, this is merely an example of coupling between the sub-pixels 49 and the scanning line SCL, and the embodiment is not limited thereto. The coupling can be appropriately modified. The signal lines DTL coupled to the three sub-pixels 49 included in one pixel 48 are different from each other.

Each of the pixels 48 includes three sub-pixels corresponding to any three of four colors including the first color, the second color, the third color, and the fourth color. Specifically, for example, the first color, the second color, and the third color are three primary colors, the first color being red (R), the second color being green (G), and the third color being blue (B). In the first embodiment, the fourth color is white (W). In FIG. 3 and some other figures, to illustrate the color of each sub-pixel 49, any of reference signs (R, G, B, and W) that indicates any of the colors may be described in the region of the sub-pixel 49.

In the first embodiment, the components of the first color, the second color, the third color, and the fourth color of the extended HSV color space indicated by the output signal correspond to the color components of four colors of the sub-pixels 49. However, the color components of the output signal do not necessarily directly correspond to the color components of the sub-pixels 49. For example, maximum luminance of a single color that can be achieved by at least one of the color components of the sub-pixels 49 may be higher than maximum luminance of the single color that is defined in the extended HSV color space indicated by the output signal.

More specifically, the display device 10 is a transmissive color liquid crystal display device, for example. The image display panel 40 is a color liquid crystal display panel in which a first color filter that transmits a first primary color is arranged between the sub-pixel 49 of red and an image observer, a second color filter that transmits a second primary color is arranged between the sub-pixel 49 of green and the image observer, and a third color filter that transmits a third primary color is arranged between the sub-pixel 49 of blue and the image observer. In the image display panel 40, no color filter is arranged between the sub-pixel 49 of white and the image observer. A transparent resin layer may be provided to the sub-pixel 49 of white in place of the color filter.

Among the three sub-pixels 49 included in one pixel 48, the color of the sub-pixel 49C having a larger area than that of the other sub-pixels 49A and 49B is any of the first color, the second color, and the third color. In other words, the color of the sub-pixel 49C is not the fourth color. On the other hand, the color of each of the sub-pixels 49A and 49B is any of the first color, the second color, the third color, and the fourth color. As described above, the sub-pixel 49 of the fourth color (for example, white) is one of the other two sub-pixels (for example, the sub-pixels 49A and 49B).

Figure 4:
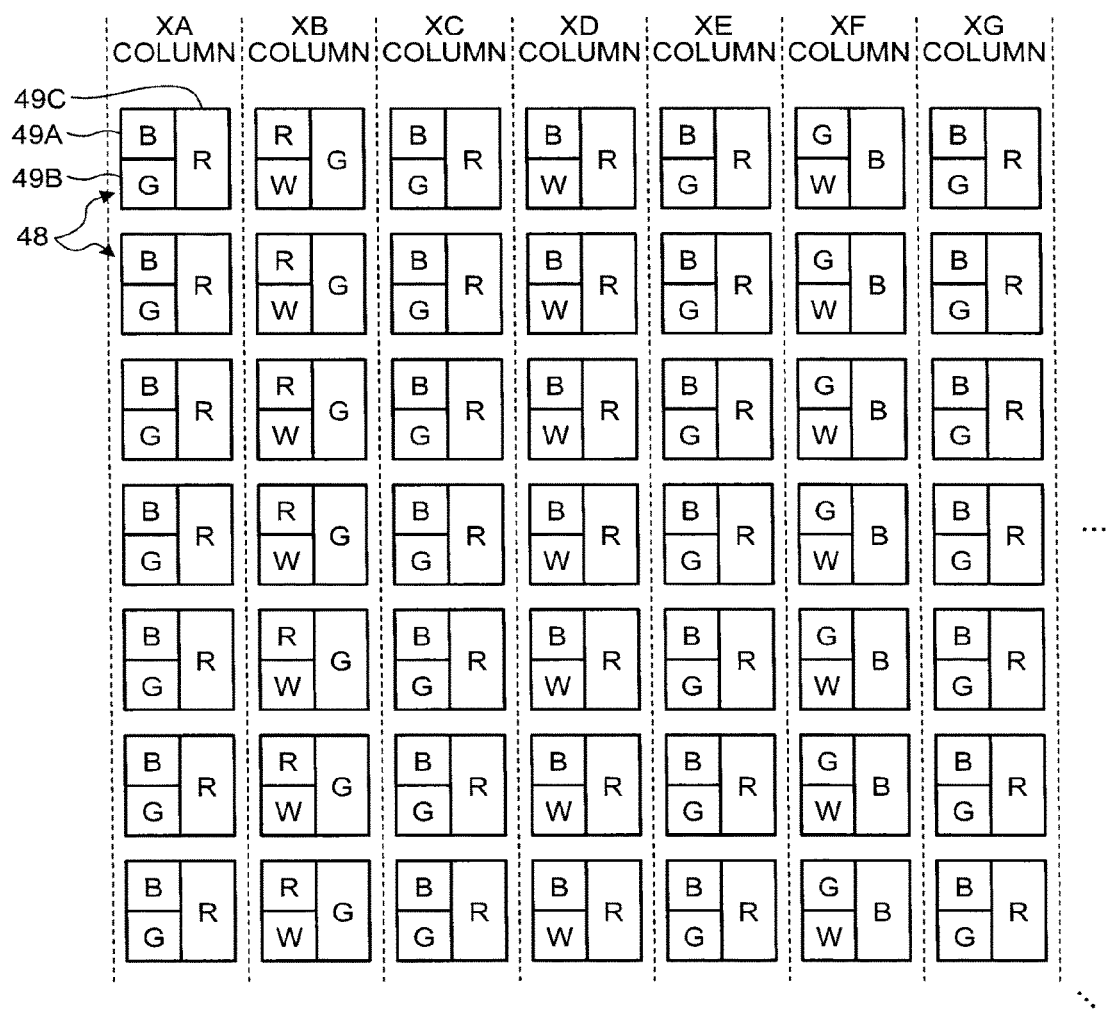
FIG. 4 is a diagram illustrating an example of colors of sub-pixels in 7 rows×7 columns of pixels among a plurality of pixels included in the image display panel.

The following describes the arrangement of the colors of the sub-pixels 49 included in each of the pixels 48 according to the first embodiment with reference to FIG. 4. FIG. 4 is a diagram illustrating an example of the colors of the sub-pixels 49 in 7 rows×7 columns of pixels 48 among the pixels 48 included in the image display panel 40. For convenience, the 7 columns of pixels illustrated in FIG. 4 are denoted by reference signs of a column XA, a column XB, a column XC, a column XD, a column XE, a column XF, and a column XG sequentially from the left. In the display unit (for example, the image display panel 40), the pixels 48 each including the sub-pixel 49 of the fourth color (for example, white) are not adjacent to each other in at least one of the two directions (for example, the row direction). Specifically, as illustrated in FIG. 4 for example, pixels 48 each including the sub-pixel 49B of white among all the pixels 48 are arranged every other column in the row direction as follows: the XB column, the XD column, the XF column . . . . No sub-pixel 49 of white is provided to the image display panel 40 except the sub-pixel 49B in the pixel 48 included in such every other pixel column.

The colors of the sub-pixels 49 included in the pixel 48 according to the first embodiment are unified in units of a pixel column. Specifically, the XA column, the XC column, and the XE column (and the XG column) have the same pixel 48, which includes the sub-pixel 49A of blue, the sub-pixel 49B of green, and the sub-pixel 49C of red, for example. All of the pixels 48 included in the XB column each include the sub-pixel 49A of red, the sub-pixel 49B of white, and the sub-pixel 49C of green. All of the pixels 48 included in the XD column each include the sub-pixel 49A of blue, the sub-pixel 49B of white, and the sub-pixel 49C of red. All of the pixels 48 included in the XF column each include the sub-pixel 49A of green, the sub-pixel 49B of white, and the sub-pixel 49C of blue. In this way, in the display unit (for example, the image display panel 40), the pixel 48 including the sub-pixel (for example, the sub-pixel 49B) of the fourth color (for example, white) and the pixel 48 including the sub-pixel (for example, the sub-pixel 49C) of the first color (for example, red), the sub-pixel (for example, the sub-pixel 49B) of the second color (for example, green), and the sub-pixel (for example, the sub-pixel 49A) of the third color (for example, blue) are alternately arranged in at least one of the two directions (for example, the row direction).

In the image display panel 40 according to the first embodiment, the pixels 48 are arranged so that the same arrangement patterns of the pixels 48 are repeated in units of 6 columns. Accordingly, the pixel 48 included in the XG column is the same as the pixel 48 included in the XA column. The pixel columns on the right side of the XG column have the same arrangement pattern of the pixels 48 in the row direction from the XA column to the XF column as follows: the same pixel column as the XB column, the same pixel column as the XC column, . . . .

As described above, according to the first embodiment, the sub-pixel 49 of the fourth color (for example, white) is one (for example, the sub-pixel 49B) of the two sub-pixels each smaller than the other sub-pixel (for example, the sub-pixel 49C). Accordingly, the area of the fourth color in one pixel 48 is smaller than that in a case in which the other sub-pixel has the fourth color. In the display unit (for example, the image display panel 40), the pixels 48 each including the sub-pixel of the fourth color are not adjacent to each other in at least one of the two directions (for example, the row direction). That is, the pixel 48 not including the sub-pixel of the fourth color is necessarily present between the pixels 48 each including the sub-pixel of the fourth color in at least the one direction. Due to this presence, in the display unit, the area occupied by the first color (for example, red), the second color (for example, green), and the third color (for example, blue) can be further increased. Thus, according to the first embodiment, under the condition that the sub-pixels 49 of four colors including the first color, the second color, the third color, and the fourth color are included, luminance of the first color, the second color, and the third color can be further increased. The first embodiment can achieve both of an advantage obtained by using the fourth color in addition to the first color, the second color, and the third color as the color of the sub-pixel 49 and higher luminance of the first color, the second color, and the third color.

In at least one of the two directions (for example, the row direction), the pixel 48 including the sub-pixel of the fourth color and the pixel 48 including the sub-pixel 49 of the first color, the sub-pixel 49 of the second color, and the sub-pixel 49 of the third color are alternately arranged. Accordingly, the sub-pixels of the fourth color can be further dispersed in the display unit, and uniformity of the colors of the display unit can be further improved.

In a case where the first color is red, the second color is green, and the third color is blue, processing related to color conversion from the input signal to the output signal can be further simplified when the input signal is an RGB signal. In a case where the fourth color is white, a component including all of the three colors including red (R), green (G), and blue (B) among luminance components output from the pixel 48 can be allocated to the sub-pixel of white (W).

As in the first embodiment, by causing the areas of the sub-pixels 49 allocated to the first color, the second color, and the third color to be different, a color reproduction tendency in the display unit can be arbitrarily adjusted.

Second Embodiment

Figure 5:
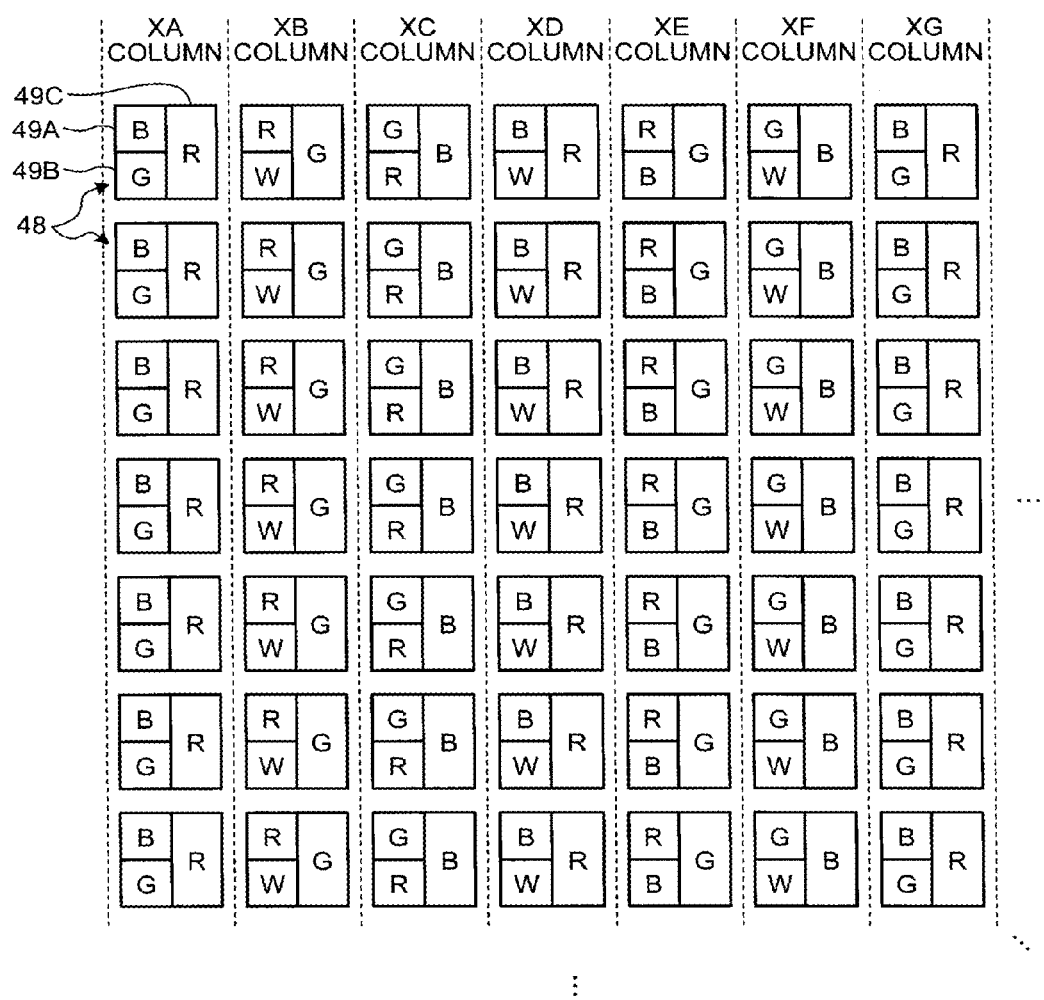
FIG. 5 is a diagram illustrating an example of colors of sub-pixels in 7 rows×7 columns of pixels among a plurality of pixels included in an image display panel according to a second embodiment.

Next, the following describes a second embodiment for implementing the present invention. The same component as that of the first embodiment may be denoted by the same reference numeral, and the description thereof will not be repeated in some cases. FIG. 5 is a diagram illustrating an example of the colors of the sub-pixels 49 in 7 rows×7 columns of pixels 48 among the pixels 48 included in the image display panel 40 according to the second embodiment. In the second embodiment, similarly to the first embodiment, the same arrangement patterns of the pixels 48 will be repeated in units of 6 columns. However, in the second embodiment, the colors of the sub-pixels included in the pixels of at least 2 columns among 3 columns including the column XA, the column XC, and the column XE are different from those in the first embodiment. Specifically, as illustrated in FIG. 5 for example, all of the pixels 48 included in the XA column in the second embodiment are the same as the pixels 48 included in the XA column in the first embodiment, and each include the sub-pixel 49A of blue, the sub-pixel 49B of green, and the sub-pixel 49C of red. On the other hand, all of the pixels 48 included in the XC column in the second embodiment each include the sub-pixel 49A of green, the sub-pixel 49B of red, and the sub-pixel 49C of blue. All of the pixels 48 included in the XE column in the second embodiment each include the sub-pixel 49A of red, the sub-pixel 49B of blue, and the sub-pixel 49C of green. In FIG. 5, the XA column is the same as that in the first embodiment. However, this is merely an example of a color pattern of the sub-pixels 49 in the pixel 48 according to the second embodiment, and the embodiment is not limited thereto. For example, the positions of the XA column, the XC column, and the XE column in the second embodiment may be replaced with each other.

In the second embodiment, the sub-pixels are arranged so that the total area of the sub-pixels 49 of the first color (for example, red), the total area of the sub-pixels 49 of the second color (for example, green), and the total area of the sub-pixels 49 of the third color (for example, blue) are equal to each other in units of a set of a certain number of pixels 48 (for example, a set of 1 row×6 columns of pixels 48) arranged along one direction (for example, the row direction). Specifically, in a display region of 1 row×6 columns of pixels 48 in the second embodiment, each of the number of the sub-pixels 49A of red, the number of the sub-pixels 49A of blue, and the number of the sub-pixels 49A of green is 2, and the numbers are equal to each other. In the display region, each of the number of the sub-pixels 49B of red, the number of the sub-pixels 49B of blue, and the number of the sub-pixels 49B of green is 1, and the numbers are equal to each other. In the display region, each of the number of the sub-pixels 49C of red, the number of the sub-pixels 49C of blue, and the number of the sub-pixels 49C of green is 2, and the numbers are equal to each other. In this way, in the display unit according to the second embodiment (for example, the image display panel 40), the total area of the sub-pixels 49 of the first color (for example, red), the total area of the sub-pixels 49 of the second color (for example, green), and the total area of the sub-pixels 49 of the third color (for example, blue) in a certain display region (for example, the display region of 1 row×6 columns of pixels 48) are equal to each other.

By causing the number of the pixels 48 in one direction (for example, the row direction) along which the set of the certain number of pixels 48 is arranged in the display unit (for example, the image display panel 40) to be a multiple of the number of the pixels 48 included in the set (for example, a multiple of 6), the total area of the sub-pixels 49 of the first color (for example, red), the total area of the sub-pixels 49 of the second color (for example, green), and the total area of the sub-pixels 49 of the third color (for example, blue) included in the display unit can be caused to be equal to each other. The second embodiment is the same as the first embodiment except characteristics related to a ratio among the sub-pixels 49 of the first color, the second color, and the third color described above.

FIG. 6 is a diagram illustrating an example of a comparison of patterns of sub-pixels constituting the pixel 48 when the luminance of the first color, the second color, and the third color as a single color, white luminance, and the width of the sub-pixel in one direction (for example, the row direction) are converted into numerical values for each of the patterns. The white luminance illustrated in FIG. 6 is defined based on the luminance of white obtained by combining the first color, the second color, and the third color (for example, red, green, and blue). The width of the sub-pixel 49 illustrated in FIG. 6 is a width when the image display panel 40 of 550 ppi is used.

Suppose that the luminance of each single color and the white luminance are defined as "1" in the display unit that includes only pixels 48S each including stripe-shaped sub-pixels of three colors including the first color, the second color, and the third color and each having the same area as in the uppermost pattern of FIG. 6. In this case, as in the second pattern from the top of FIG. 6, the luminance of each single color and the white luminance are "0.75" in the display unit that includes only pixels 48T each including stripe-shaped sub-pixels of four colors including the first color, the second color, the third color, and the fourth color and each having the same area. That is, the luminance of each single color and the white luminance in the second pattern from the top are 0.75 times the luminance of each single color and the white luminance in the uppermost pattern. As in the third pattern from the top of FIG. 6, when a half number of the pixels 48 included in the display unit each include the sub-pixel 49C of the fourth color, the colors of the other sub-pixels 49 are the first color, the second color, and the third color, and the area of the sub-pixels 49 of the first color, the area of the sub-pixels 49 of the second color, and the area of the sub-pixels 49 of the third color are equal to each other, the luminance of each single color and the white luminance are "substantially 0.71". On the other hand, the luminance of each single color and the white luminance are "substantially 0.82" in the second embodiment. In this way, according to the second embodiment, the luminance of the first color, the second color, and the third color can be further increased in the display device including the sub-pixels 49 of four colors of the first color, the second color, the third color, and the fourth color.

When the image display panel 40 of 550 ppi is used, the width of one pixel 48 in one direction (for example, the row direction) is 46.2 [μm]. In this case, as illustrated in FIG. 6, the width of each sub-pixel in the uppermost pattern and the second pattern is obtained by dividing the width of the pixel by the number of the sub-pixels (⅓, ¼). Accordingly, the width of each sub-pixel in the uppermost pattern is 15.4 [μm] and that in the second pattern is 11.55 [μm]. On the other hand, an average width of the sub-pixels 49 in the third pattern and the second embodiment is 23.1 [μm], which is ½ of the width of the pixel 48. In this way, according to the second embodiment, the width of the sub-pixel 49 can be further increased. Thus, according to the present invention including the second embodiment, the width of the sub-pixel 49 can be further increased with respect to the width of the pixel 48 in achieving high definition of the display unit (for example, the image display panel 40) by miniaturizing the pixel 48, so that technical difficulty in miniaturizing the sub-pixel 49 can be reduced, and high definition can be achieved more easily.

In the second embodiment, the sub-pixels are arranged so that the total area of the sub-pixels 49 of the first color (for example, red), the total area of the sub-pixels 49 of the second color (for example, green), and the total area of the sub-pixels 49 of the third color (for example, blue) are equal to each other in units of a set of 1 row×6 columns of pixels 48. Thus, naturally, the area of the sub-pixels 49 of the first color, the area of the sub-pixels 49 of the second color, and the area of the sub-pixels 49 of the third color are equal to each other also in a set of the pixels 48 the number of columns of which corresponds to a multiple of 6, such as a set of 1 row×12 columns of pixels 48, a set of 1 row×18 columns of pixels 48, . . . . Accordingly, in the second embodiment, the certain number is a multiple of 6. However, this is merely an example of the certain number, and the embodiment is not limited thereto. The certain number may be appropriately changed corresponding to an area ratio of each of the sub-pixels 49A, 49B, and 49C, an allocating pattern of the first color, the second color, and the third color with respect to the sub-pixels 49A, 49B, and 49C, and the like.

As described above, according to the second embodiment, in addition to the advantage of the first embodiment, the total area of the sub-pixels 49 of the first color (for example, red), the total area of the sub-pixels 49 of the second color (for example, green), and the total area of the sub-pixels 49 of the third color (for example, blue) are equal to each other in the certain display region (for example, the display region of 1 row×6 columns of pixels 48). Due to the fact that the areas are equal, a color reproducibility that does not cause deviation in any of the first color, the second color, and the third color in the display region can be obtained.

The sub-pixels are arranged so that the total area of the sub-pixels 49 of the first color, the total area of the sub-pixels 49 of the second color, and the total area of the sub-pixels 49 of the third color are equal to each other in units of a set of a certain number of pixels 48 (for example, a set of 1 row×6 columns of pixels 48) arranged along one direction (for example, the row direction). Thus, by causing the number of the pixels 48 arranged in the one direction in the display unit (for example, the image display panel 40) to be a multiple of the certain number, the total area of the sub-pixels 49 of the first color, the total area of the sub-pixels 49 of the second color, and the total area of the sub-pixels 49 of the third color in the display unit can be caused to be equal to each other. Accordingly, the color reproducibility that does not cause deviation in any of the first color, the second color, and the third color can be obtained. Even if the number of the pixels 48 arranged in the one direction in the display unit is not the multiple of the certain number, the color reproducibility that does not substantially cause deviation in any of the first color, the second color, and the third color can be obtained as long as the number of the pixels 48 arranged in the one direction in the display unit is sufficiently larger than the certain number.

Third Embodiment

Figure 7:
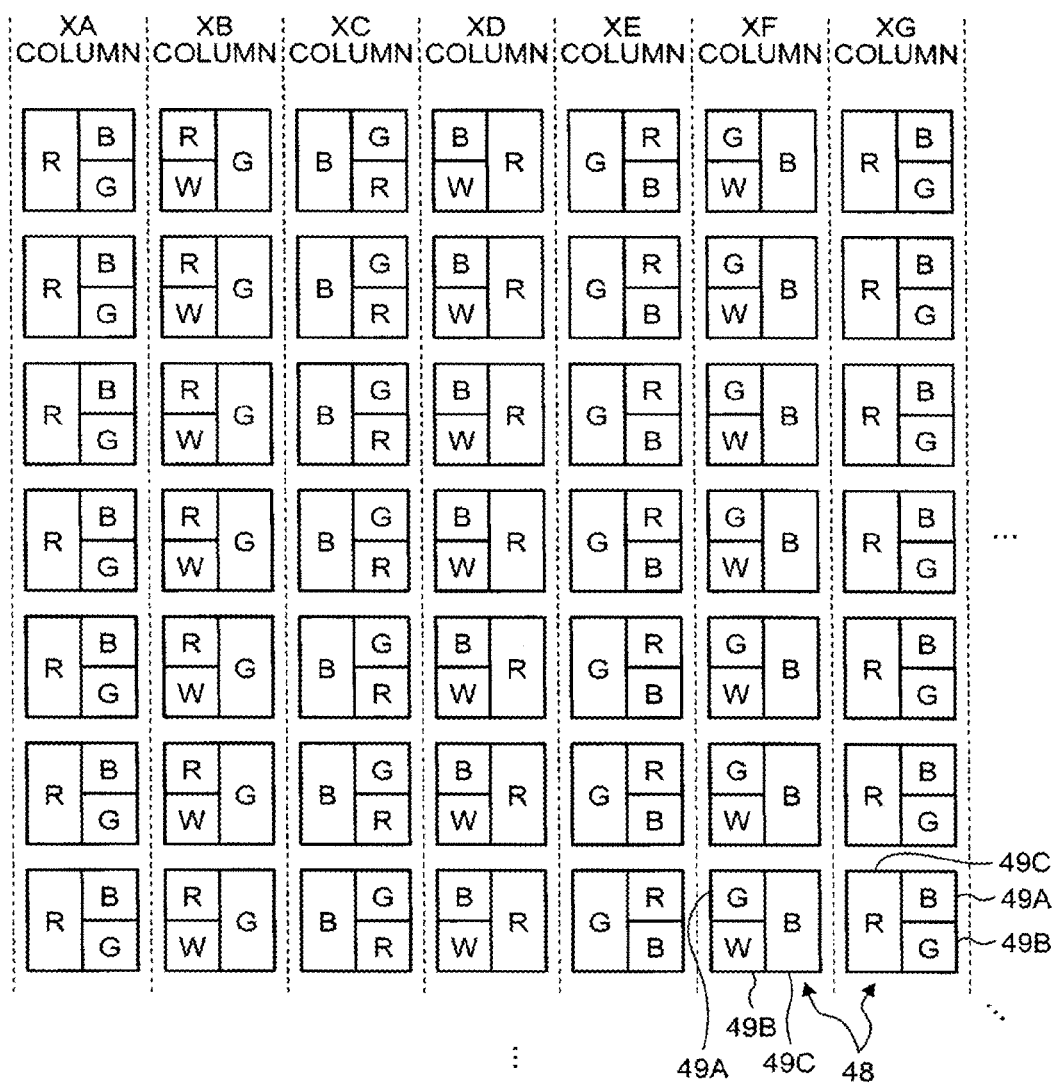
FIG. 7 is a diagram illustrating an example of colors of sub-pixels in 7 rows×7 columns of pixels among a plurality of pixels included in an image display panel according to a third embodiment.

Next, the following describes a third embodiment for implementing the present invention. The same component as that of the first embodiment and others may be denoted by the same reference numeral, and the description thereof will not be repeated in some cases. FIG. 7 is a diagram illustrating an example of the colors of the sub-pixels 49 in 7 rows×7 columns of pixels 48 among the pixels 48 included in the image display panel 40 according to the third embodiment. The third embodiment is the same as the second embodiment except that the positions of the sub-pixels 49A and 49B in the row direction are replaced with the position of the sub-pixel 49C in the row direction in some pixel columns, as compared with the second embodiment.

Specifically, in the third embodiment, as illustrated in FIG. 7 for example, the positions of the sub-pixels 49A and 49B in the row direction are replaced with the position of the sub-pixel 49C in the row direction in the XA column, the XC column, and the XE column as compared with the second embodiment. Due to this replacement, in the third embodiment, the sub-pixels 49A and 49B are present on the right side in the pixel 48, and the sub-pixel 49C is present on the left side in the pixel 48 in the XA column, the XC column, and the XE column. The example illustrated in FIG. 7 is merely a specific example of replacement of the positions of the sub-pixels 49A and 49B in the row direction with the position of the sub-pixel 49C in the row direction, and the third embodiment is not limited thereto. Specifically, for example, in all of the pixels 48 according to the third embodiment, the sub-pixels 49A and 49B may be present on the right side in the pixel 48 and the sub-pixel 49C may be present on the left side in the pixel 48. Alternatively, the sub-pixels 49A and 49B may be present on the right side in the pixel 48 and the sub-pixel 49C may be present on the left side in the pixel 48 in the other pixel columns such as the XB column, the XD column, and the XF column.

As described above, the same advantage as that of the second embodiment can be obtained according to the third embodiment.

Fourth Embodiment

Figure 8:
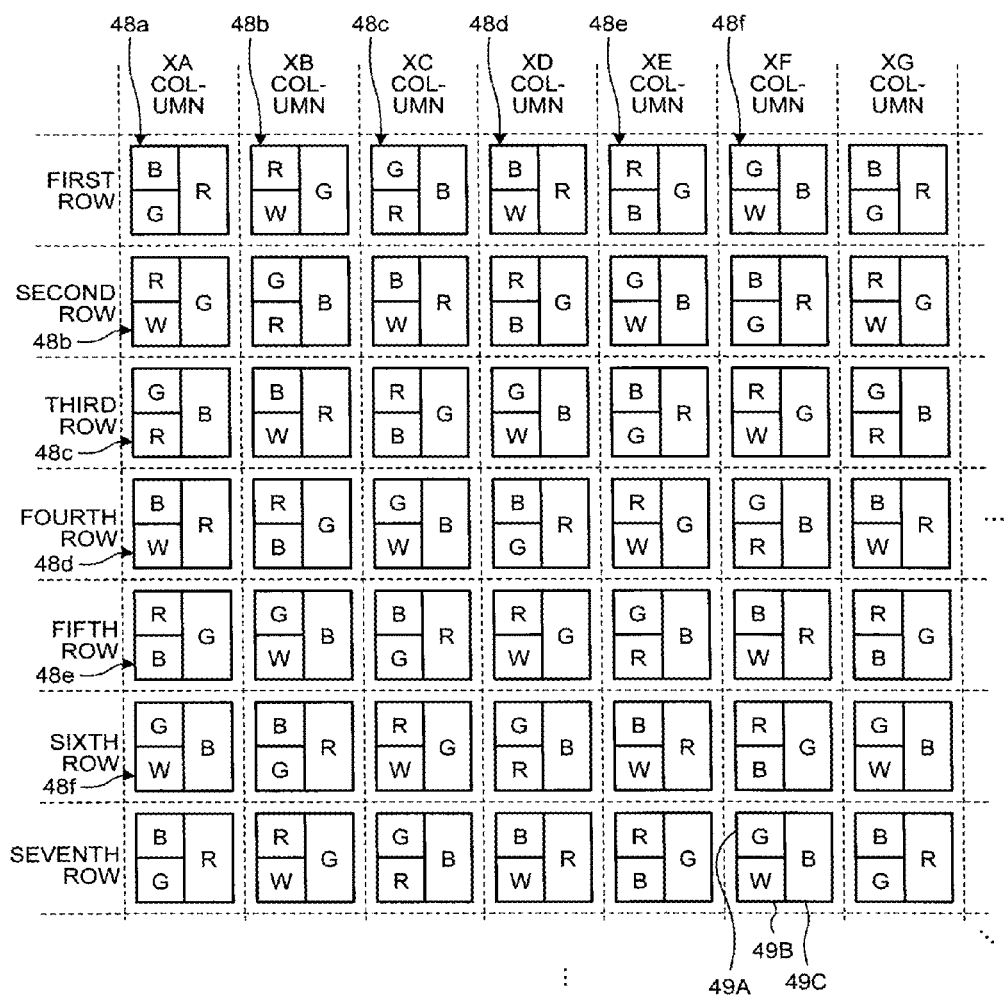
FIG. 8 is a diagram illustrating an example of colors of sub-pixels in 7 rows×7 columns of pixels among a plurality of pixels included in an image display panel according to a fourth embodiment.

Next, the following describes a fourth embodiment for implementing the present invention. The same component as that of the first embodiment and others may be denoted by the same reference numeral, and the description thereof will not be repeated in some cases. FIG. 8 is a diagram illustrating an example of the colors of the sub-pixels 49 in 7 rows×7 columns of pixels 48 among the pixels 48 included in the image display panel 40 according to the fourth embodiment. In the display unit (for example, the image display panel 40) according to the fourth embodiment, the pixels 48 each including the sub-pixel 49 of the fourth color (for example, white) are not adjacent to each other in two directions (the row direction and the column direction). Specifically, as illustrated in FIG. 8 for example, among the pixels 48, the pixels 48 each including the sub-pixel 49B of white are arranged alternately with the pixels 48 not including the sub-pixel 49 of white in the row direction and the column direction. That is, the pixels 48 each including the sub-pixel 49B of white are arranged in even rows (the second row, the fourth row, the sixth row, . . . , the q-th row) of the XA column, the XC column, and the XE column, and in odd rows (the first row, the third row, the fifth row, . . . , the (q−1)-th row) of the XB column, the XD column, and the XF column. In other words, in the fourth embodiment, the pixels 48 each including the sub-pixel 49B of white and the pixels 48 not including the sub-pixel 49 of white are arranged to form a checkered pattern.

In the fourth embodiment, similarly to the second embodiment and the third embodiment, the sub-pixels are arranged so that the total area of the sub-pixels 49 of the first color (for example, red), the total area of the sub-pixels 49 of the second color (for example, green), and the total area of the sub-pixels 49 of the third color (for example, blue) are equal to each other in units of a set of a certain number of pixels 48 (for example, a set of 1 row×6 columns of pixels 48) arranged along one direction (for example, the row direction). Specifically, as illustrated in FIG. 8, the pixel including the sub-pixel 49A of blue, the sub-pixel 49B of green, and the sub-pixel 49C of red is a pixel 48a. The pixel including the sub-pixel 49A of red, the sub-pixel 49B of white, and the sub-pixel 49C of green is a pixel 48b. The pixel including the sub-pixel 49A of green, the sub-pixel 49B of red, and the sub-pixel 49C of blue is a pixel 48c. The pixel including the sub-pixel 49A of blue, the sub-pixel 49B of white, and the sub-pixel 49C of red is a pixel 48d. The pixel including the sub-pixel 49A of red, the sub-pixel 49B of blue, and the sub-pixel 49C of green is a pixel 48e. The pixel including the sub-pixel 49A of green, the sub-pixel 49B of white, and the sub-pixel 49C of blue is a pixel 48f. In the first pixel row, along the row direction, the pixels are sequentially arranged from the position of the XA column in the order of the pixel 48a, the pixel 48b, the pixel 48c, the pixel 48d, the pixel 48e, and the pixel 48f. Following this arrangement, the pixels are periodically arranged along the row direction in units of 6 pixels. In the second pixel row, along the row direction, the pixels are sequentially arranged from the position of the XA column in the order of the pixel 48b, the pixel 48c, the pixel 48d, the pixel 48e, the pixel 48f, and the pixel 48a. In the third pixel row, along the row direction, the pixels are sequentially arranged from the position of the XA column in the order of the pixel 48c, the pixel 48d, the pixel 48e, the pixel 48f, the pixel 48a, and the pixel 48b. In the fourth pixel row, along the row direction, the pixels are sequentially arranged from the position of the XA column in the order of the pixel 48d, the pixel 48e, the pixel 48f, the pixel 48a, the pixel 48b, and the pixel 48c. In the fifth pixel row, along the row direction, the pixels are sequentially arranged from the position of the XA column in the order of the pixel 48e, the pixel 48f, the pixel 48a, the pixel 48b, the pixel 48c, and the pixel 48d. In the sixth pixel row, along the row direction, the pixels are sequentially arranged from the position of the XA column in the order of the pixel 48f, the pixel 48a, the pixel 48b, the pixel 48c, the pixel 48d, and the pixel 48e. In the second and the following pixel rows, the pixels are also periodically arranged in units of 6 pixels.

In the image display panel 40 according to the fourth embodiment, the pixels 48 are arranged so that the same arrangement patterns of the pixels 48 are repeated in units of 6 rows. Thus, the arrangement of the pixel 48 included in the seventh pixel row is the same as the arrangement of the pixel 48 included in the first pixel row. In the eighth and the following pixel rows, the arrangement patterns of the pixel 48 in the first to the sixth rows are repeated as follows: the same arrangement of the pixel 48 as that in the second pixel row, the same arrangement of the pixel 48 as that in the third pixel row, . . . .

Figure 9:
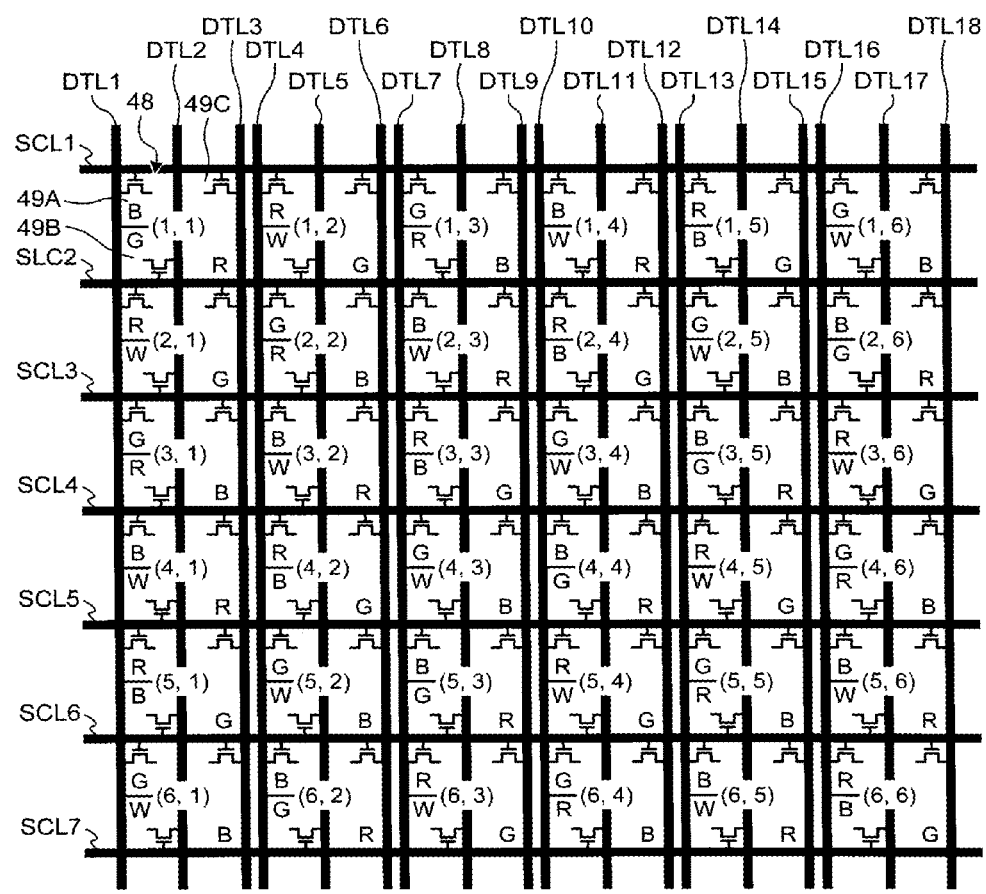
FIG. 9 is a diagram illustrating an example of signal lines and scanning lines coupled to 6 rows×6 columns of pixels among the pixels included in the image display panel according to the fourth embodiment.

FIG. 9 is a diagram illustrating an example of the signal lines DTL and the scanning lines SCL coupled to 6 rows×6 columns of pixels 48 among the pixels 48 included in the image display panel 40 according to the fourth embodiment. In FIG. 9, coordinates of an upper left pixel 48 are (X, Y)=(1, 1) for convenience, and each of the pixels 48 is represented by the coordinates to distinguish the positions of the pixels 48 from each other. FIG. 10 is a diagram illustrating an example of a relation between the output signal output to the signal line DTL illustrated in FIG. 9 and scanning timing based on an output to the scanning line SCL. In the description of FIG. 10 and the following description, the coordinates of the pixels in FIG. 9 are referred to. In the description of FIG. 10, described are only output signals with respect to the sub-pixels 49 included in the pixels 48 illustrated in FIG. 9, and output signals with respect to the other sub-pixels 49 (not illustrated) will not be described.

Where m=1, 2, . . . , p, the signal line DTL(3$m$-2) is coupled to the sub-pixel 49A of each pixel 48. The signal line DTL(3$m$-1) is coupled to the sub-pixel 49B of each pixel 48. The signal line DTL(3$m$) is coupled to the sub-pixel 49C of each pixel 48. Where n=1, the scanning line SCL(1) is coupled to the sub-pixel 49A and the sub-pixel 49C of the pixel 48 in the first row. Where n=2, 3, 4, 5, . . . , q, the scanning line SCL(n) is coupled to the sub-pixel 49B in the (n-1)-th row and the sub-pixels 49A and 49C in the n-th row. The scanning line SCL(q+1) as the last scanning line is coupled to the sub-pixel 49B of the pixel 48 in the q-th row.

As illustrated in FIG. 10, for example, at a timing when the scanning line SCL1 is turned on, each signal line DTL outputs the output signal to the sub-pixel 49 coupled to the scanning line SCL1. Specifically, for example, the output signal B(1, 1) indicating the luminance of blue is output to the sub-pixel 49A included in the pixel 48 of (1, 1). Similarly, the output signal R(1, 1) indicating the luminance of red is output to the sub-pixel 49C included in the pixel 48 of (1, 1). To the sub-pixels 49A and 49C included in the other pixels 48, as illustrated in FIG. 10, the output signal corresponding to the coordinates of each pixel 48 and the color of the sub-pixel 49 is output. At a timing when the scanning line SCL2 is turned on, each signal line DTL outputs the output signal to the sub-pixel 49 coupled to the scanning line SCL2. Specifically, for example, the output signal G(1, 1) indicating the luminance of green is output to the sub-pixel 49B included in the pixel 48 of (1, 1). The output signal R(2, 1) indicating the luminance of red is output to the sub-pixel 49A included in the pixel 48 of (2, 1). Similarly, the output signal G(2, 1) indicating the luminance of green is output to the sub-pixel 49C included in the pixel 48 of (2, 1). To the sub-pixels 49 included in the other pixels 48, as illustrated in FIG. 10, the output signal corresponding to the coordinates of each pixel 48 and the color of the sub-pixel 49 is output. For example, the output signal w(1, 2) indicating the luminance of white is output to the sub-pixel 49B included in the pixel 48 of (1, 2). Each sub-pixel 49 performs output of the luminance corresponding to the output signal.

As described above, the output signal is based on the extended value of the extended HSV color space extended with the components of the first color, the second color, the third color, and the fourth color. Thus, output signals output to the pixel 48 (m, n) include output signals of four colors of output signals R(m, n), G(m, n), B(m, n), and W(m, n). On the other hand, the number of the sub-pixels 49 in the pixel 48 is three. Thus, the output signal of one of the colors cannot be output at a position corresponding to the coordinates (m, n) of the pixel 48. In the embodiment of the present invention, an output corresponding to the output signal of the color that cannot be output at a position corresponding to the coordinates (m, n) of the pixel 48 is performed using another pixel 48 including the sub-pixel 49 of the corresponding color.

FIGS. 11 to 14 are diagrams illustrating an alternative output example of the output according to the output signal of the color that cannot be output at a position corresponding to the coordinates (m, n) of the pixel 48. For example, the pixel 48 of (1, 1) includes the sub-pixels 49 of red, green, and blue. The output signals R(1, 1), G(1, 1), and B(1, 1) are directly output to the sub-pixel 49 included in the pixel 48 of (1, 1). These sub-pixels 49 perform output corresponding to the output signals. On the other hand, the output signal W(1, 1) of white with respect to the pixel 48 of (1, 1) cannot be directly output by the pixel 48 of (1, 1) because the pixel 48 of (1, 1) does not include the sub-pixel 49 of white. Thus, the output corresponding to such an output signal of white is performed as an alternative output using the pixel (for example, the pixel 48 of (1, 2)) including the sub-pixel 49 of white. Specifically, the output signal w(1, 2) indicating the luminance of white with respect to the sub-pixel 49B of white included in the pixel 48 of (1, 2) is a signal indicating a value (average value) obtained by averaging a total value of a luminance value of white indicated by the output signal W(1, 1) corresponding to the position of the pixel 48 of (1, 1) and the luminance value of white indicated by the output signal W(1, 2) corresponding to the position of the pixel 48 of (1, 2). That is, according to the embodiment of the present invention, the output signal w(1, 2) is output to the sub-pixel 49B of white included in the pixel 48 of (1, 2) while being replaced with such an average value.

On the other hand, the pixel 48 of (1, 2) does not include the sub-pixel 49 of blue. Thus, the output signal B(1, 2) of blue cannot be directly output by the pixel 48 of (1, 2). Accordingly, similarly to the sub-pixel 49 of white, the output corresponding to such an output signal of blue is performed as an alternative output using the sub-pixel 49 of blue included in another pixel 48.

Specifically, the output signal b(1, 3) indicating the luminance of blue with respect to the sub-pixel 49C of blue included in the pixel 48 of (1, 3) is a signal indicating a value (average value) obtained by averaging a total value of the luminance value of blue indicated by the output signal B(1, 2) corresponding to the position of the pixel 48 of (1, 2) and the luminance value of blue indicated by the output signal B(1, 3) corresponding to the position of the pixel 48 of (1, 3). The same process is performed for an output signal corresponding to color of a sub-pixel 49 that is not included in each of the other pixels 48. That is, the output process is performed using the sub-pixel 49 of the corresponding color included in a pixel 48 adjacent to each of the other pixels 48. In this description, the output corresponding to the color of the sub-pixel 49 that is not included in the pixel 48 is performed using the sub-pixel 49 of the corresponding color included in another pixel 48 adjacent to the right side of the pixel 48. However, this is merely an example of the alternative output of the output corresponding to the color of the sub-pixel 49 not included in the pixel 48, and the embodiment is not limited thereto. A method of determining the pixel 48 that performs the alternative output can be appropriately modified. In view of a color reproducibility with respect to an output result before the alternative output is performed, the alternative output is preferably performed by using the sub-pixel 49 being as close to an original position as possible. In FIGS. 10 and 11, and in the above description, reference signs that indicate the colors of the output signals corresponding to the original position of the pixel 48 are denoted by upper-case letters (R, G, B, and W), and the reference signs that indicate the colors of the output signals replaced with average values through the alternative output are denoted by lower-case letters (r, g, b, and w).

A configuration for performing an operation related to the alternative output and generation processing of the output signal is arbitrary. For example, the operation and the processing may be completed at the time when the signal processing unit 20 outputs the output signal to the image-display-panel drive circuit 30, or the signal output circuit 31 of the image-display-panel drive circuit 30 may perform the operation and the generation processing. Another configuration (such as a circuit) may be provided for the operation and the generation processing. Although the alternative output has been described in the fourth embodiment, such an alternative output can also be applied to other embodiments including the first to the third embodiments.

As described above, according to the fourth embodiment, in addition to the advantage of the second embodiment, the pixel 48 including the sub-pixel (for example, the sub-pixel 49B) of the fourth color (for example, white), and the pixel 48 including the sub-pixel 49 of the first color (for example, red), the sub-pixel 49 of the second color (for example, green), and the sub-pixel 49 of the third color (for example, blue) are alternately arranged in the two directions (the row direction and the column direction). Due to this arrangement, the sub-pixels 49 of the fourth color can be further dispersed in the display unit, and uniformity of the colors of the display unit can be further improved.

As described in the fourth embodiment, the color of the pixel not included in a certain pixel 48 can be compensated with another pixel 48 by performing alternative output.

Modification

FIGS. 15 to 19 are diagrams illustrating another example of the colors of the sub-pixels 49 in 7 rows×7 columns of pixels 48 among the pixels 48 included in the image display panel 40. The arrangement of the colors of the sub-pixels 49 in the pixels 48 included in the image display panel 40 is not limited to those described in the first to the fourth embodiments, and can be appropriately modified as illustrated in the example of FIGS. 15 to 19, for example. In the arrangement of the colors of the sub-pixels 49 in the example illustrated in FIGS. 15 to 19, similarly to the example illustrated in FIG. 8, the pixels are periodically arranged in units of 6 pixels along the row direction, and the same arrangement patterns of the pixel 48 are repeated in units of 6 rows. As illustrated in FIGS. 15 to 19, a pixel including the sub-pixel 49A of green, the sub-pixel 49B of white, and the sub-pixel 49C of red is a pixel 48g. A pixel including the sub-pixel 49A of blue, the sub-pixel 49B of white, and the sub-pixel 49C of green is a pixel 48h. A pixel including the sub-pixel 49A of red, the sub-pixel 49B of white, and the sub-pixel 49C of blue is a pixel 48i.

Figure 15:
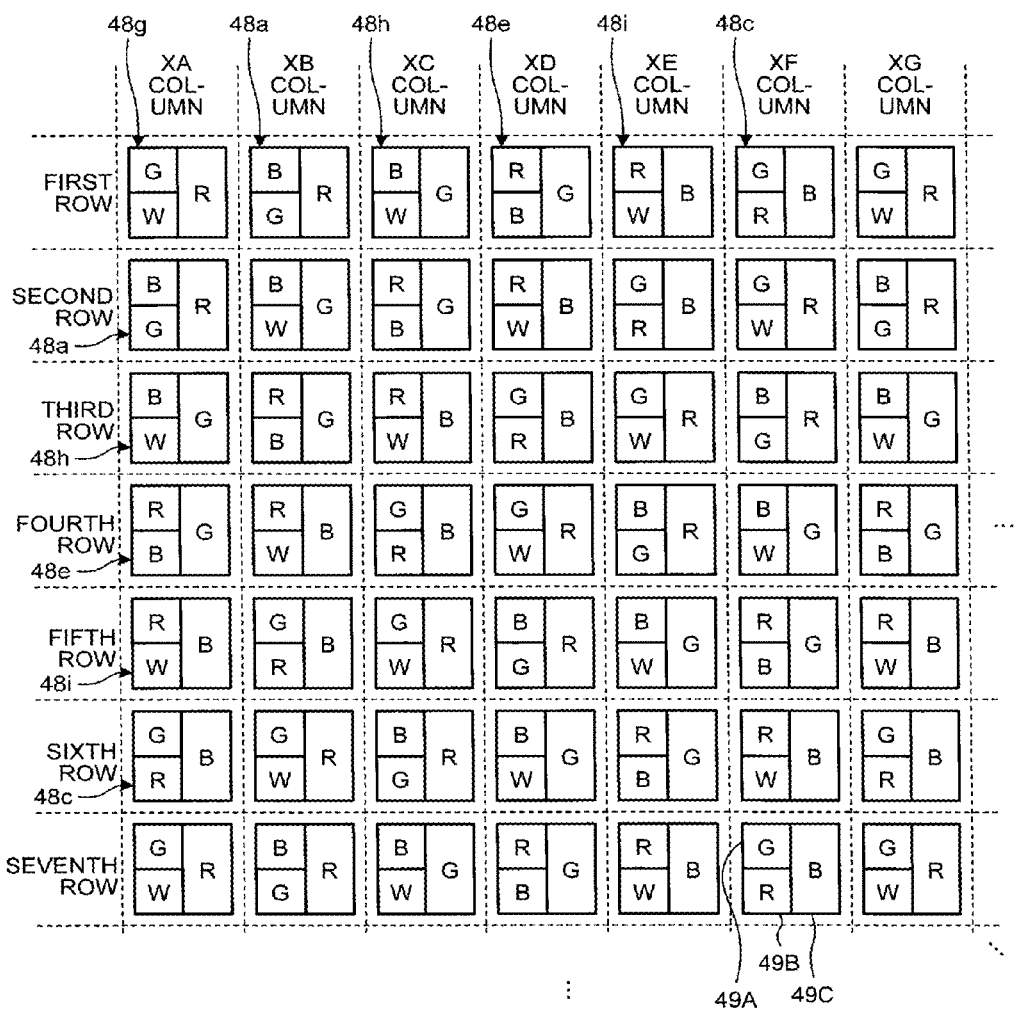
FIG. 15 is a diagram illustrating another example of the colors of the sub-pixels in 7 rows×7 columns of pixels among the pixels included in the image display panel.

In the example illustrated in FIG. 15, in the first pixel row, the pixels are sequentially arranged from the position of the XA column in the order of the pixel 48g, the pixel 48a, the pixel 48h, the pixel 48e, the pixel 48i, and the pixel 48c along the row direction. In the second pixel row, along the row direction, the pixels are sequentially arranged from the position of the XA column in the order of the pixel 48a, the pixel 48h, the pixel 48e, the pixel 48i, the pixel 48c, and the pixel 48g. In the third pixel row, along the row direction, the pixels are sequentially arranged from the position of the XA column in the order of the pixel 48h, the pixel 48e, the pixel 48i, the pixel 48c, the pixel 48g, and the pixel 48a. In the fourth pixel row, along the row direction, the pixels are sequentially arranged from the position of the XA column in the order of the pixel 48e, the pixel 48i, the pixel 48c, the pixel 48g, the pixel 48a, and the pixel 48h. In the fifth pixel row, along the row direction, the pixels are sequentially arranged from the position of the XA column in the order of the pixel 48i, the pixel 48c, the pixel 48g, the pixel 48a, the pixel 48h, and the pixel 48e. In the sixth pixel row, along the row direction, the pixels are sequentially arranged from the position of the XA column in the order of the pixel 48c, the pixel 48g, the pixel 48a, the pixel 48h, the pixel 48e, and the pixel 48i.

Figure 16:
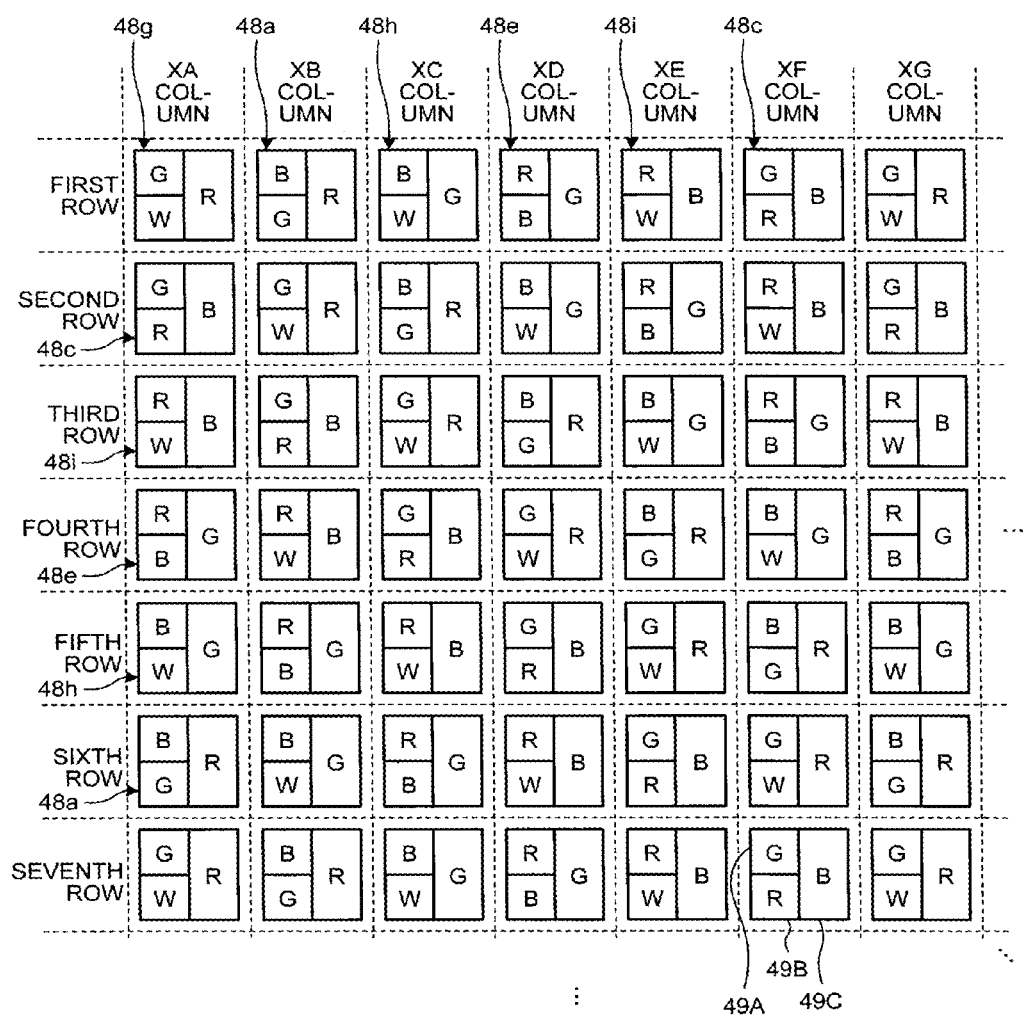
FIG. 16 is a diagram illustrating another example of the colors of the sub-pixels in 7 rows×7 columns of pixels among the pixels included in the image display panel.

In the example illustrated in FIG. 16, in the first pixel row, the pixels are sequentially arranged from the position of the XA column in the order of the pixel 48g, the pixel 48a, the pixel 48h, the pixel 48e, the pixel 48i, and the pixel 48c along the row direction. In the second pixel row, along the row direction, the pixels are sequentially arranged from the position of the XA column in the order of the pixel 48c, the pixel 48g, the pixel 48a, the pixel 48h, the pixel 48e, and the pixel 48i. In the third pixel row, along the row direction, the pixels are sequentially arranged from the position of the XA column in the order of the pixel 48i, the pixel 48c, the pixel 48g, the pixel 48a, the pixel 48h, and the pixel 48e. In the fourth pixel row, along the row direction, the pixels are sequentially arranged from the position of the XA column in the order of the pixel 48e, the pixel 48i, the pixel 48c, the pixel 48g, the pixel 48a, and the pixel 48h. In the fifth pixel row, along the row direction, the pixels are sequentially arranged from the position of the XA column in the order of the pixel 48h, the pixel 48e, the pixel 48i, the pixel 48c, the pixel 48g, and the pixel 48a. In the sixth pixel row, along the row direction, the pixels are sequentially arranged from the position of the XA column in the order of the pixel 48a, the pixel 48h, the pixel 48e, the pixel 48i, the pixel 48c, and the pixel 48g.

Figure 17:
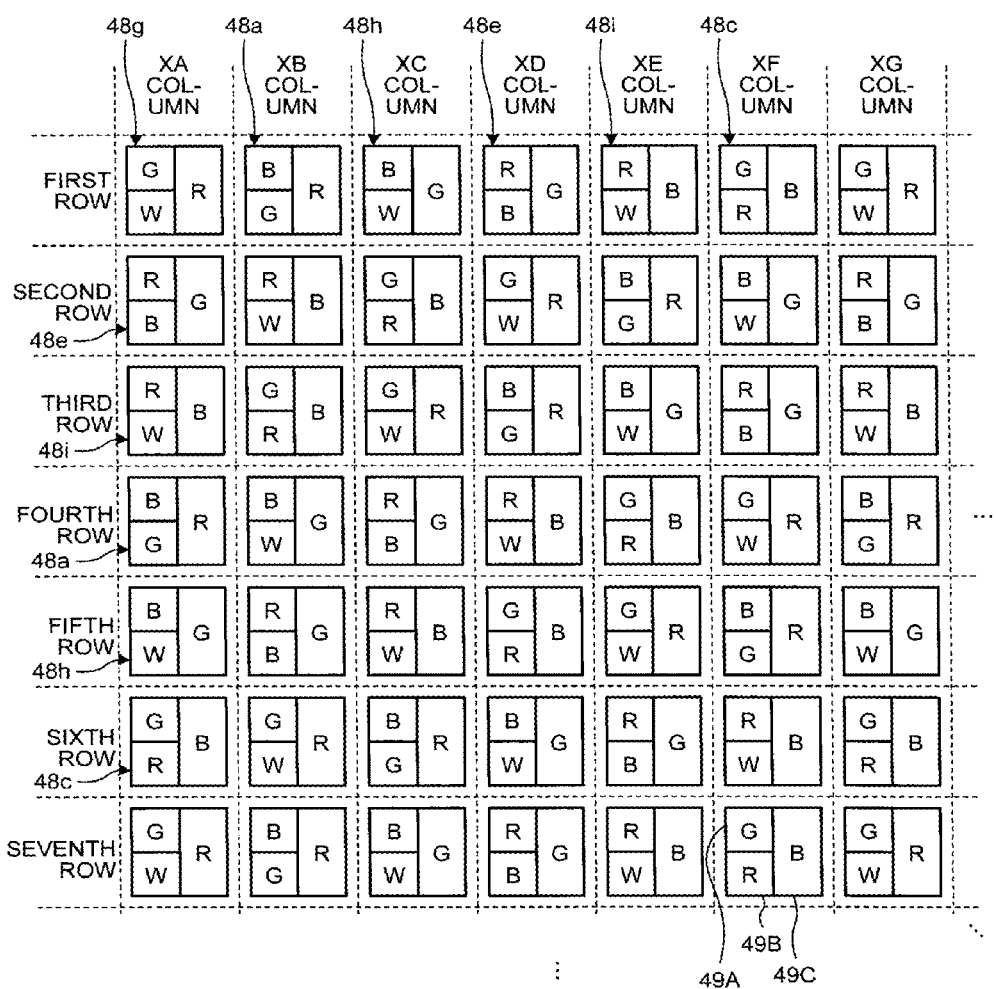
FIG. 17 is a diagram illustrating another example of the colors of the sub-pixels in 7 rows×7 columns of pixels among the pixels included in the image display panel.

In the example illustrated in FIG. 17, in the first pixel row, the pixels are sequentially arranged from the position of the XA column in the order of the pixel 48g, the pixel 48a, the pixel 48h, the pixel 48e, the pixel 48i, and the pixel 48c along the row direction. In the second pixel row, along the row direction, the pixels are sequentially arranged from the position of the XA column in the order of the pixel 48e, the pixel 48i, the pixel 48c, the pixel 48g, the pixel 48a, and the pixel 48h. In the third pixel row, along the row direction, the pixels are sequentially arranged from the position of the XA column in the order of the pixel 48i, the pixel 48c, the pixel 48g, the pixel 48a, the pixel 48h, and the pixel 48e. In the fourth pixel row, along the row direction, the pixels are sequentially arranged from the position of the XA column in the order of the pixel 48a, the pixel 48h, the pixel 48e, the pixel 48i, the pixel 48c, and the pixel 48g. In the fifth pixel row, along the row direction, the pixels are sequentially arranged from the position of the XA column in the order of the pixel 48h, the pixel 48e, the pixel 48i, the pixel 48c, the pixel 48g, and the pixel 48a. In the sixth pixel row, along the row direction, the pixels are sequentially arranged from the position of the XA column in the order of the pixel 48c, the pixel 48g, the pixel 48a, the pixel 48h, the pixel 48e, and the pixel 48i.

Figure 18:
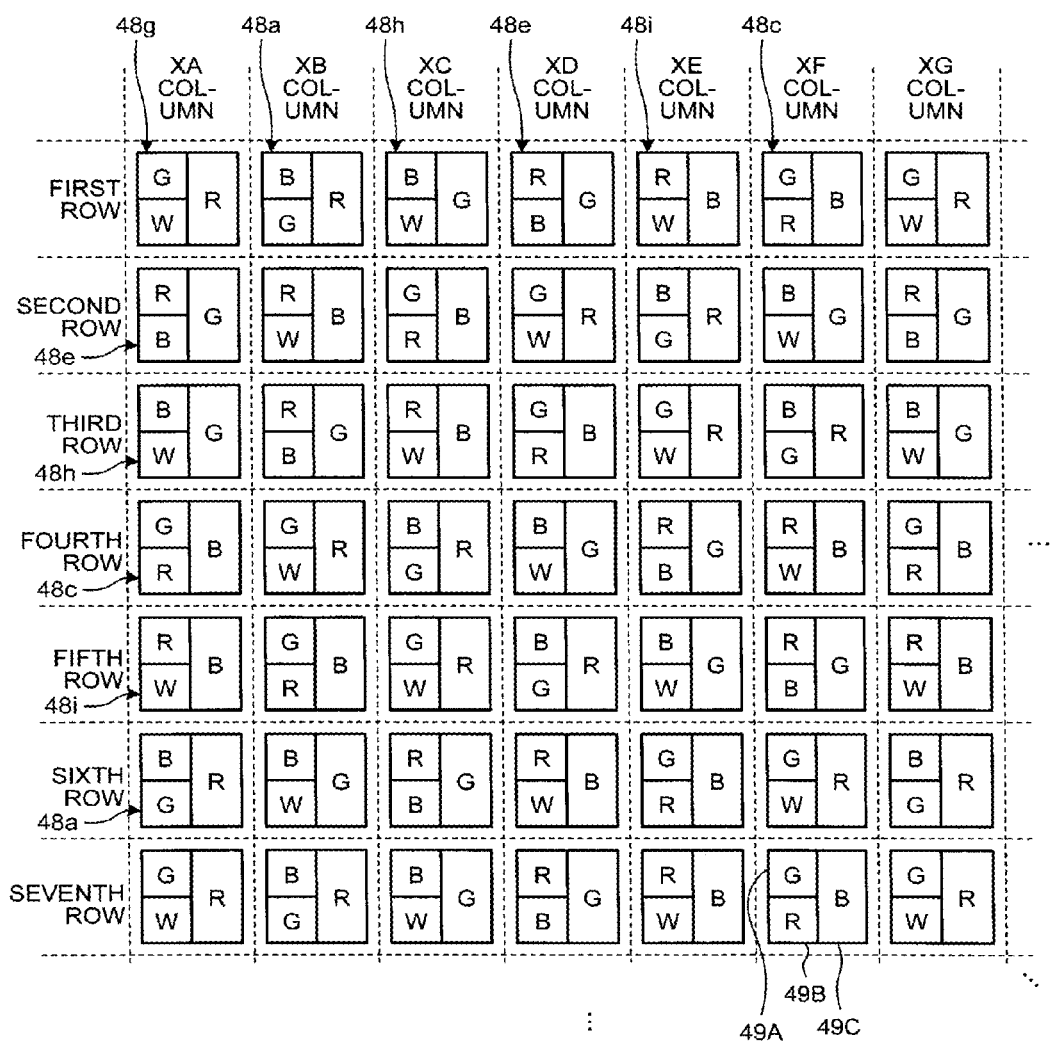
FIG. 18 is a diagram illustrating another example of the colors of the sub-pixels in 7 rows×7 columns of pixels among the pixels included in the image display panel.

In the example illustrated in FIG. 18, in the first pixel row, the pixels are sequentially arranged from the position of the XA column in the order of the pixel 48g, the pixel 48a, the pixel 48h, the pixel 48e, the pixel 48i, and the pixel 48c along the row direction. In the second pixel row, along the row direction, the pixels are sequentially arranged from the position of the XA column in the order of the pixel 48e, the pixel 48i, the pixel 48c, the pixel 48g, the pixel 48a, and the pixel 48h. In the third pixel row, along the row direction, the pixels are sequentially arranged from the position of the XA column in the order of the pixel 48h, the pixel 48e, the pixel 48i, the pixel 48c, the pixel 48g, and the pixel 48a. In the fourth pixel row, along the row direction, the pixels are sequentially arranged from the position of the XA column in the order of the pixel 48c, the pixel 48g, the pixel 48a, the pixel 48h, the pixel 48e, and the pixel 48i. In the fifth pixel row, along the row direction, the pixels are sequentially arranged from the position of the XA column in the order of the pixel 48i, the pixel 48c, the pixel 48g, the pixel 48a, the pixel 48h, and the pixel 48e. In the sixth pixel row, along the row direction, the pixels are sequentially arranged from the position of the XA column in the order of the pixel 48a, the pixel 48h, the pixel 48e, the pixel 48i, the pixel 48c, and the pixel 48g.

Figure 19:
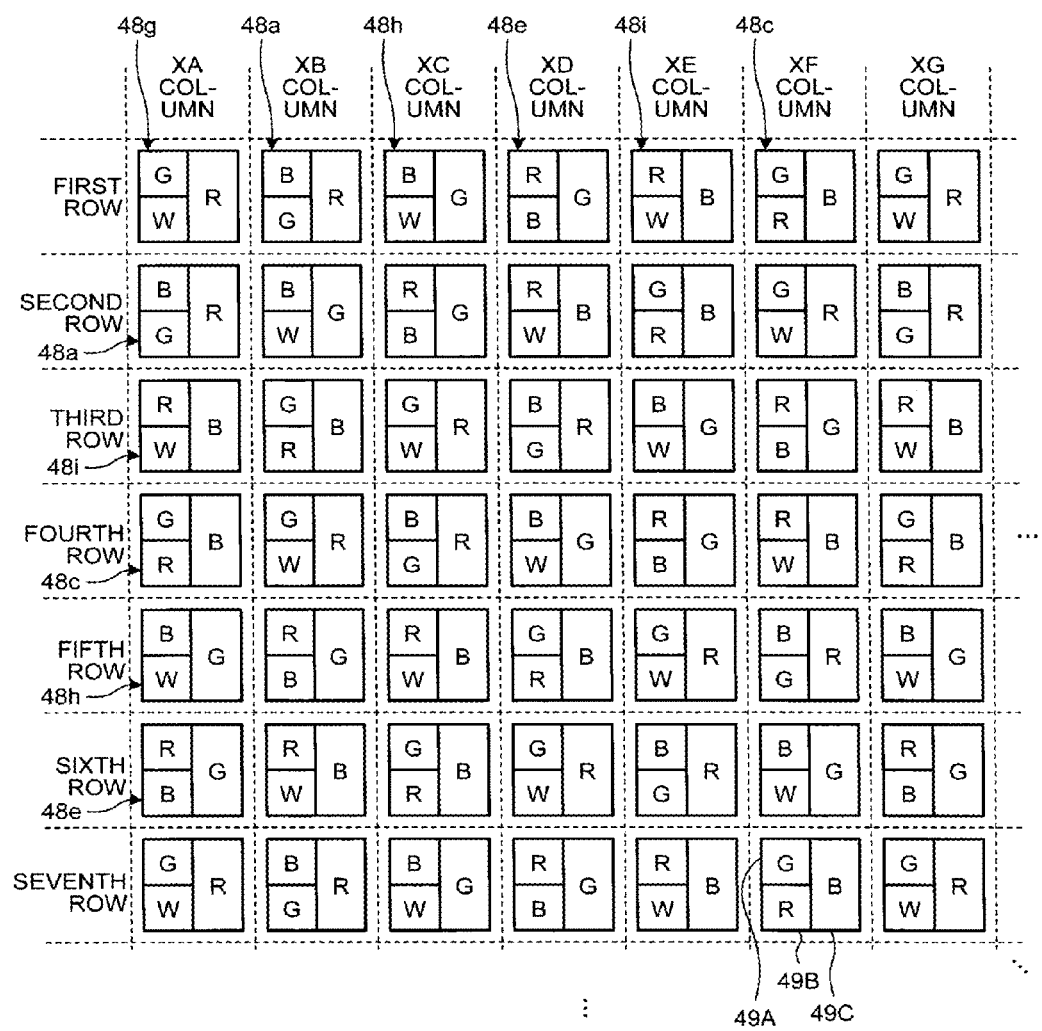
FIG. 19 is a diagram illustrating another example of the colors of the sub-pixels in 7 rows×7 columns of pixels among the pixels included in the image display panel.

In the example illustrated in FIG. 19, in the first pixel row, the pixels are sequentially arranged from the position of the XA column in the order of the pixel 48g, the pixel 48a, the pixel 48h, the pixel 48e, the pixel 48i, and the pixel 48c along the row direction. In the second pixel row, along the row direction, the pixels are sequentially arranged from the position of the XA column in the order of the pixel 48a, the pixel 48h, the pixel 48e, the pixel 48i, the pixel 48c, and the pixel 48g. In the third pixel row, along the row direction, the pixels are sequentially arranged from the position of the XA column in the order of the pixel 48i, the pixel 48c, the pixel 48g, the pixel 48a, the pixel 48h, and the pixel 48e. In the fourth pixel row, along the row direction, the pixels are sequentially arranged from the position of the XA column in the order of the pixel 48c, the pixel 48g, the pixel 48a, the pixel 48h, the pixel 48e, and the pixel 48i. In the fifth pixel row, along the row direction, the pixels are sequentially arranged from the position of the XA column in the order of the pixel 48h, the pixel 48e, the pixel 48i, the pixel 48c, the pixel 48g, and the pixel 48a. In the sixth pixel row, along the row direction, the pixels are sequentially arranged from the position of the XA column in the order of the pixel 48e, the pixel 48i, the pixel 48c, the pixel 48g, the pixel 48a, and the pixel 48h. In the second and the following pixel rows, the pixels are also periodically arranged in units of 6 pixels.

Figure 20:
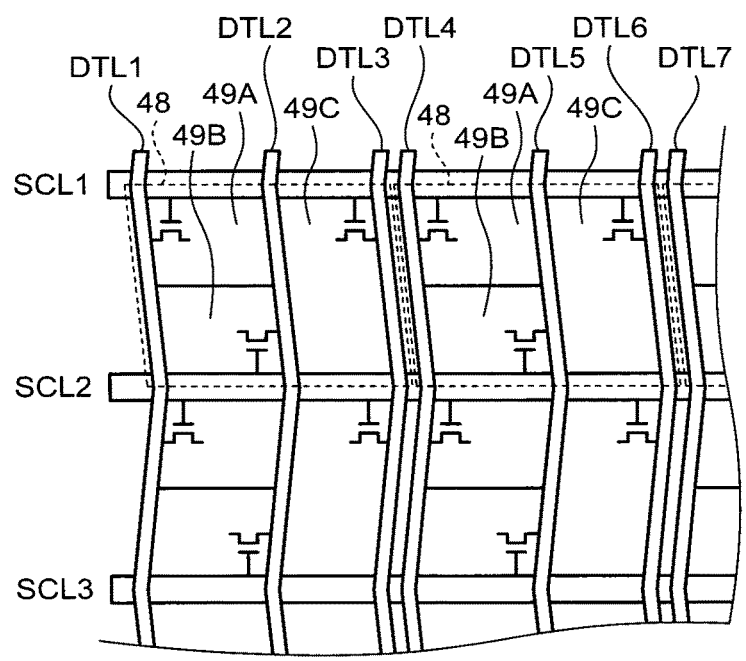
FIG. 20 is a diagram illustrating a pixel arrangement in part of an image display panel according to a modification.

FIG. 20 is a diagram illustrating a pixel arrangement in part of the image display panel according to a modification. The pixel 48 may have a shape other than a rectangle. For example, the shape of the pixel may be a parallelogram or other polygons. Alternatively, some or all of the sides of the pixel 48 may draw an arc. As illustrated in FIG. 20, the signal line DTL may be bent. In the example illustrated in FIG. 20, the signal line DTL is bent at a position where the signal line DTL three-dimensionally intersects with the scanning line SCL. However, this is merely an example of a bending position, and the embodiment is not limited thereto. The bending position is arbitrary. The scanning line SCL may also be bent. At least one of the signal line DTL and the scanning line SCL may be curved instead of being bent.

Application Example

Figure 21:
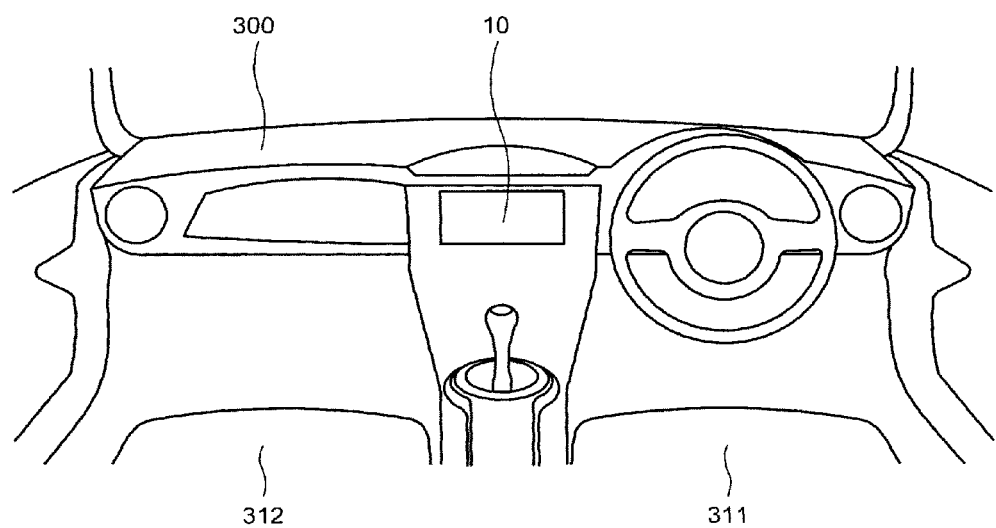
FIG. 21 is a diagram illustrating an example of an electronic apparatus to which the display device according to each embodiment is applied.
Figure 22:
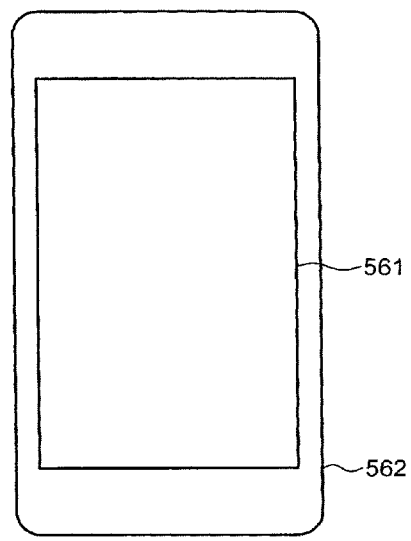
FIG. 22 is a diagram illustrating an example of an electronic apparatus to which the display device according to each embodiment is applied.

Next, the following describes application examples of the display device 10 described in each embodiment with reference to FIGS. 21 and 22. FIGS. 21 and 22 are diagrams illustrating an example of an electronic apparatus to which the display device according to each embodiment is applied. The display device 10 according to each embodiment can be applied to electronic apparatuses in various fields such as a vehicle navigation device illustrated in FIG. 21, a television apparatus, a digital camera, a notebook computer, a portable terminal device including a cellular telephone illustrated in FIG. 22, or a video camera. In other words, the display device 10 according to each embodiment can be applied to electronic apparatuses in various fields that display a video signal input from the outside or a video signal generated inside as an image or video. The application examples can be applied to display devices according to other embodiments, modifications, and other examples other than the display device 10 according to each embodiment.

The electronic apparatus illustrated in FIG. 21 is a vehicle navigation device to which the display device 10 according to each embodiment is applied. The display device 10 is installed on a dashboard 300 inside an automobile. Specifically, the display device 10 is installed on the dashboard 300 between a driver's seat 311 and a passenger seat 312. The display device 10 of the vehicle navigation device is utilized for displaying navigation, displaying a music operation screen, reproducing and displaying movies, or the like.

The electronic apparatus illustrated in FIG. 22 is a portable information terminal that operates as a mobile computer, a multifunctional mobile phone, a mobile computer capable of making a voice call, or a mobile computer capable of performing communications to which the display device 10 according to each embodiment is applied, and may be referred to as what is called a smartphone or a tablet terminal. The portable information terminal includes a display unit 561 on a surface of a housing 562, for example. The display unit 561 includes the display device 10 according to each embodiment and has a touch detection (what is called a touch panel) function capable of detecting an external proximity object.

The embodiments and the modification of the present invention have been described above. However, the embodiments and the modification are not limited thereto. The components described above include a component that is easily conceivable by those skilled in the art, substantially the same component, and what is called an equivalent. The components described above can also be appropriately combined with each other. In addition, the components can be variously omitted, replaced, or modified without departing from the gist of the embodiments and the modification described above. For example, the display device 10 may include a self-luminous image display panel 40 that uses a self-luminous body such as an organic light-emitting diode (OLED) to emit light. The color for each sub-pixel (the first color, the second color, the third color, or the fourth color) can be determined depending on a luminescent material, not limited to the color filter.

In the above embodiments, the HSV color space is employed as a color space of the color indicated by the input signal and the output signal. However, the HSV color space is merely an example of a color space that can be employed according to the present invention, and the embodiment is not limited thereto. Another color space may also be employed. The colors of the sub-pixels are not limited to red, green, blue, and white. At least one of these colors may be replaced with another color. As a specific example, a color such as yellow (Y) may be employed in place of white. In place of three primary colors including red, green, and blue, colors such as cyan (C), magenta (M), and yellow (Y) may be employed.

In the above embodiments, the width of each of the sub-pixels 49A and 49B in the row direction is the same as the width of the sub-pixel 49C in the row direction (for example, 23.1 [μm]). However, the widths are not necessarily the same. As in the above embodiments, when the width of each of the sub-pixels 49A and 49B in the row direction is the same as the width of the sub-pixel 49C in the row direction and respective areas of the sub-pixels 49A and 49B are equal to each other, the area of one sub-pixel 49C is equal to the total area of two sub-pixels 49A (or sub-pixels 49B). Accordingly, an operation related to a design for adjusting the area of the sub-pixel 49 for each color can be further simplified. The width of the pixel 48 in the row direction and the column direction, and the width of each of the sub-pixels 49 in the row direction and the column direction are arbitrary.

The present invention naturally encompasses other working advantages caused by the aspects described in the above embodiments that are obvious from the description herein or that are appropriately conceivable by those skilled in the art.

The present disclosure includes the following aspects.

(1) A display device comprising a display unit in which a plurality of pixels are arranged in a matrix along two directions intersecting with each other, wherein each of the pixels includes three sub-pixels corresponding to three of four colors including a first color, a second color, a third color, and a fourth color, an area of one sub-pixel among the three sub-pixels is larger than the area of each of the other two sub-pixels, a sub-pixel of the fourth color is one of the other two sub-pixels, and pixels each including the sub-pixel of the fourth color are not adjacent to each other in at least one of the two directions in the display unit.

(2) The display device according to (1), wherein the pixel including the sub-pixel of the fourth color and a pixel including a sub-pixel of the first color, a sub-pixel of the second color, and a sub-pixel of the third color are alternately arranged in at least one of the two directions in the display unit.

(3) The display device according to (1) or (2), wherein a total area of sub-pixels of the first color, a total area of sub-pixels of the second color, and a total area of sub-pixels of the third color are equal to each other in a certain display region in the display unit.

(4) The display device according to (3), wherein the sub-pixels are arranged so that the total area of the sub-pixels of the first color, the total area of the sub-pixels of the second color, and the total area of the sub-pixels of the third color are equal to each other in units of a set of certain number of pixels arranged in the one direction.

(5) The display device according to (4), wherein the certain number is a multiple of 6.

(6) The display device according to (1) or (2), wherein the fourth color is white.

(7) The display device according to (1) or (2), wherein the first color is red, the second color is green, and the third color is blue.

What is claimed is:

1. A display device comprising:

a display unit in which a plurality of pixels are arranged in a display region in a matrix along two directions intersecting with each other, the pixels including at least first pixels and second pixels, wherein each of the second pixels includes three sub-pixels corresponding to three colors including a first color, a second color, a third color, each of the first pixels includes sub-pixels corresponding to a fourth color and two of the three colors, the fourth color being white and being different from the first color, the second color, and the third color, each of the pixels includes three sub-pixel areas each corresponding to a respective sub-pixel, one of the three sub-pixel areas is larger than each of the other two sub-pixel areas that have a same area, a sub-pixel of the fourth color is in one of the other two sub-pixel areas, and in at least one of the two directions in the display unit, the first pixel and the second pixel are alternately arranged without the first pixels being adjacent to each other.

2. The display device according to claim 1, wherein a total area of sub-pixels of the first color, a total area of sub-pixels of the second color, and a total area of sub-pixels of the third color are equal to each other in the display region in the display unit.

3. The display device according to claim 2, wherein the sub-pixels are arranged so that the total area of the sub-pixels of the first color, the total area of the sub-pixels of the second color, and the total area of the sub-pixels of the third color are equal to each other in units of a set of predetermined natural number of pixels arranged in the one direction, the predetermined natural number is multiple of 6.

4. The display device according to claim 1, wherein the first color is red, the second color is green, and the third color is blue.

* * * * *